(12) United States Patent
Allen et al.

(10) Patent No.: US 11,653,711 B2
(45) Date of Patent: May 23, 2023

(54) SYSTEM AND METHOD FOR GENERATING ROUTE DATA

(71) Applicant: Under Armour, Inc., Baltimore, MD (US)

(72) Inventors: Jeffrey Allen, Baltimore, MD (US); F. Grant Kovach, Baltimore, MD (US); Michael Mazzoleni, Baltimore, MD (US)

(73) Assignee: Under Armour, Inc., Baltimore, MD (US)

( * ) Notice: Subject to any disclaimer, the term of this patent is extended or adjusted under 35 U.S.C. 154(b) by 441 days.

(21) Appl. No.: 16/862,847

(22) Filed: Apr. 30, 2020

(65) Prior Publication Data

US 2020/0253324 A1    Aug. 13, 2020

Related U.S. Application Data

(63) Continuation of application No. 16/152,978, filed on Oct. 5, 2018, now Pat. No. 10,674,785.

(51) Int. Cl.
| | |
|---|---|
| *A43B 7/00* | (2006.01) |
| *A63B 24/00* | (2006.01) |
| *G01R 33/02* | (2006.01) |
| *G01P 15/18* | (2013.01) |
| *G01C 21/16* | (2006.01) |

(52) U.S. Cl.
CPC ............ *A43B 7/00* (2013.01); *A63B 24/0062* (2013.01); *G01C 21/1654* (2020.08); *G01P 15/18* (2013.01); *G01R 33/0206* (2013.01); *A63B 2024/0065* (2013.01)

(58) Field of Classification Search
None
See application file for complete search history.

(56) References Cited

U.S. PATENT DOCUMENTS

| | | | |
|---|---|---|---|
| 5,899,963 | A | 5/1999 | Hutchings et al. |
| 6,549,845 | B2 | 4/2003 | Eakle, Jr. et al. |
| 6,826,477 | B2 | 11/2004 | Ladetto et al. |
| 8,224,618 | B2 | 7/2012 | Cattin et al. |
| 8,355,888 | B2 | 1/2013 | Chernoguz et al. |

(Continued)

FOREIGN PATENT DOCUMENTS

WO    2014153725 A1    10/2014

OTHER PUBLICATIONS

Unpublished U.S. Appl. No. 16/696,232 to Carpenter et al., filed Nov. 26, 2019.

(Continued)

*Primary Examiner* — Ronald Laneau
(74) *Attorney, Agent, or Firm* — Maginot, Moore & Beck, LLP

(57) ABSTRACT

A fitness tracking system includes a shoe, a magnetometer, and a controller. The magnetometer is mounted on the shoe and is configured to generate three-axis direction data in response to movement of the shoe during a predetermined time period. The controller is operably connected to the magnetometer and is configured to generate two-axis calibrated direction data based on the three-axis direction data after the predetermined time period. The two-axis calibrated direction data corresponds to an orientation of the shoe during the predetermined time period.

20 Claims, 16 Drawing Sheets

(56) References Cited

U.S. PATENT DOCUMENTS

| | | | |
|---|---|---|---|
| 8,498,811 | B2 | 7/2013 | Lundquist et al. |
| 8,812,030 | B2 | 8/2014 | Gum et al. |
| 9,161,172 | B2 | 10/2015 | Poduri et al. |
| 9,175,963 | B2 | 11/2015 | Kelly |
| 9,258,675 | B2 | 2/2016 | Smith et al. |
| 9,538,498 | B2 | 1/2017 | Smith et al. |
| 9,568,323 | B2 | 2/2017 | Li et al. |
| 9,686,745 | B2 | 6/2017 | Oleson et al. |
| 10,030,988 | B2 * | 7/2018 | Brush ............... G06F 16/9537 |
| 10,194,714 | B2 | 2/2019 | McGinnity et al. |
| 10,898,756 | B2 * | 1/2021 | Kovach ............. A63B 24/0021 |
| 2009/0066569 | A1 | 3/2009 | Hunter et al. |
| 2009/0138200 | A1 | 5/2009 | Hunter et al. |
| 2011/0054836 | A1 | 3/2011 | Foxlin |
| 2012/0102784 | A1 * | 5/2012 | Buder ................. A43B 21/433 36/83 |
| 2013/0110454 | A1 | 5/2013 | Sidhu et al. |
| 2013/0130843 | A1 | 5/2013 | Burroughs |
| 2013/0178958 | A1 | 7/2013 | Kulach et al. |
| 2014/0201126 | A1 | 7/2014 | Zadeh |
| 2014/0302852 | A1 | 10/2014 | Ostergaard et al. |
| 2016/0075245 | A1 | 3/2016 | Loginov et al. |
| 2016/0121164 | A1 | 5/2016 | Coza |
| 2016/0123738 | A1 | 5/2016 | Bellusci et al. |
| 2016/0180440 | A1 | 6/2016 | DiBenedetto |
| 2016/0278652 | A1 | 9/2016 | Kaib et al. |
| 2016/0335913 | A1 | 11/2016 | Grant et al. |
| 2017/0007885 | A1 | 1/2017 | Kerwin |
| 2017/0219359 | A1 | 8/2017 | Elhoushi |
| 2017/0354348 | A1 * | 12/2017 | Winter ................... G06F 30/20 |
| 2019/0105535 | A1 | 4/2019 | Kovach et al. |

OTHER PUBLICATIONS

DC Rainmaker, Hands-on: The New Suunto 9 Multisport GPS Watch, on-line article, Jun. 5, 2018, available at: https://www.dcrainmaker.com/2018/06/hands-on-the-new-suunto-9-multisport-gps-watch.html (20 pages).

* cited by examiner

110 ELECTRICAL SYSTEM

202 MAGNETOMETER

210 CONTROLLER

204 ACCELEROMETER

208 MEMORY

218 DIRECTION DATA

222 FOOTSTRIKE DATA

230 ACCELERATION DATA

206 TRANSCEIVER

232 MOVEMENT DATA

SPEED DATA

DISTANCE DATA

CADENCE DATA

STRIDE LENGTH DATA

GROUND CONTACT TIME

212 TEMPERATURE SENSOR

FIG. 2

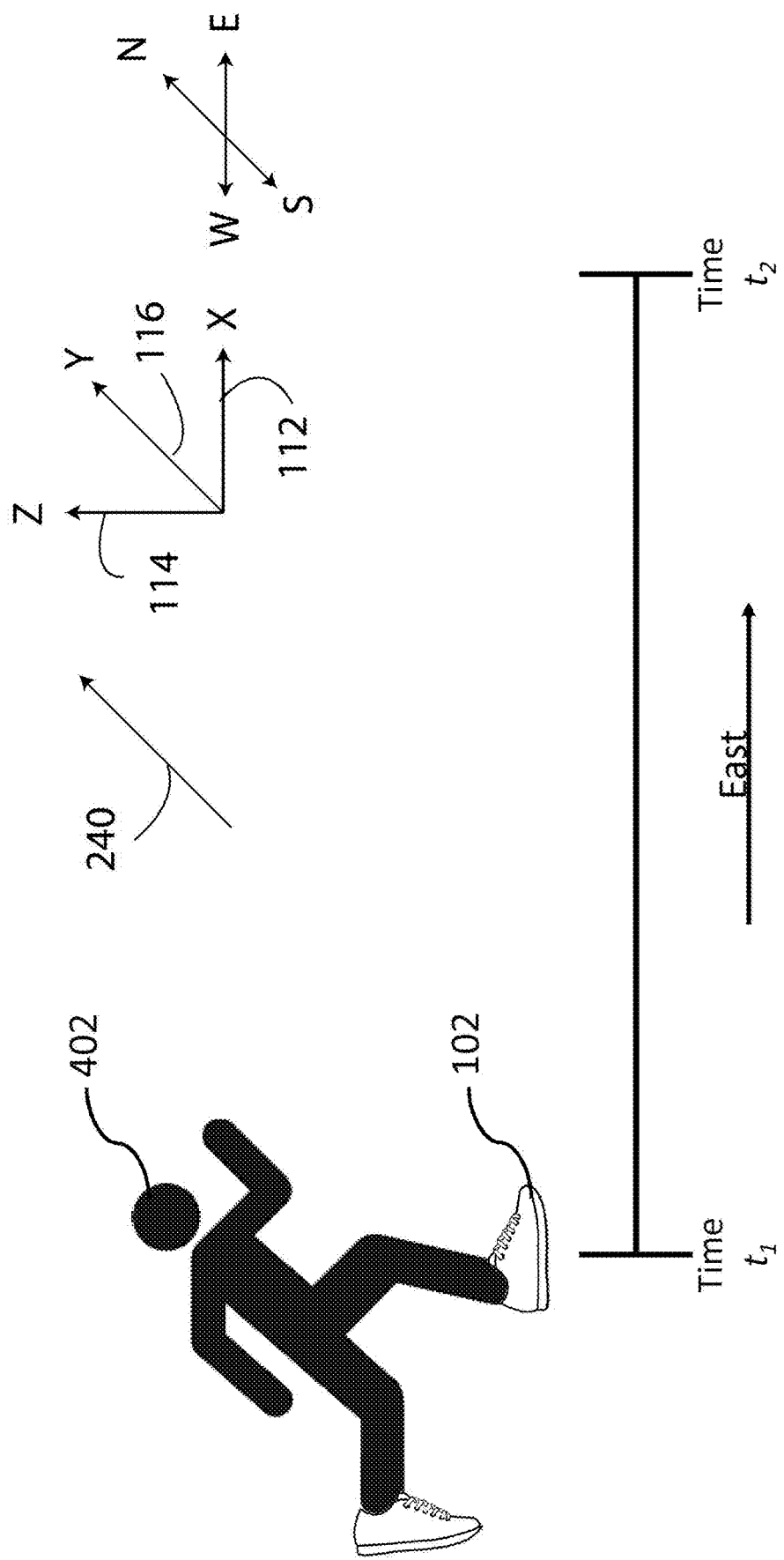

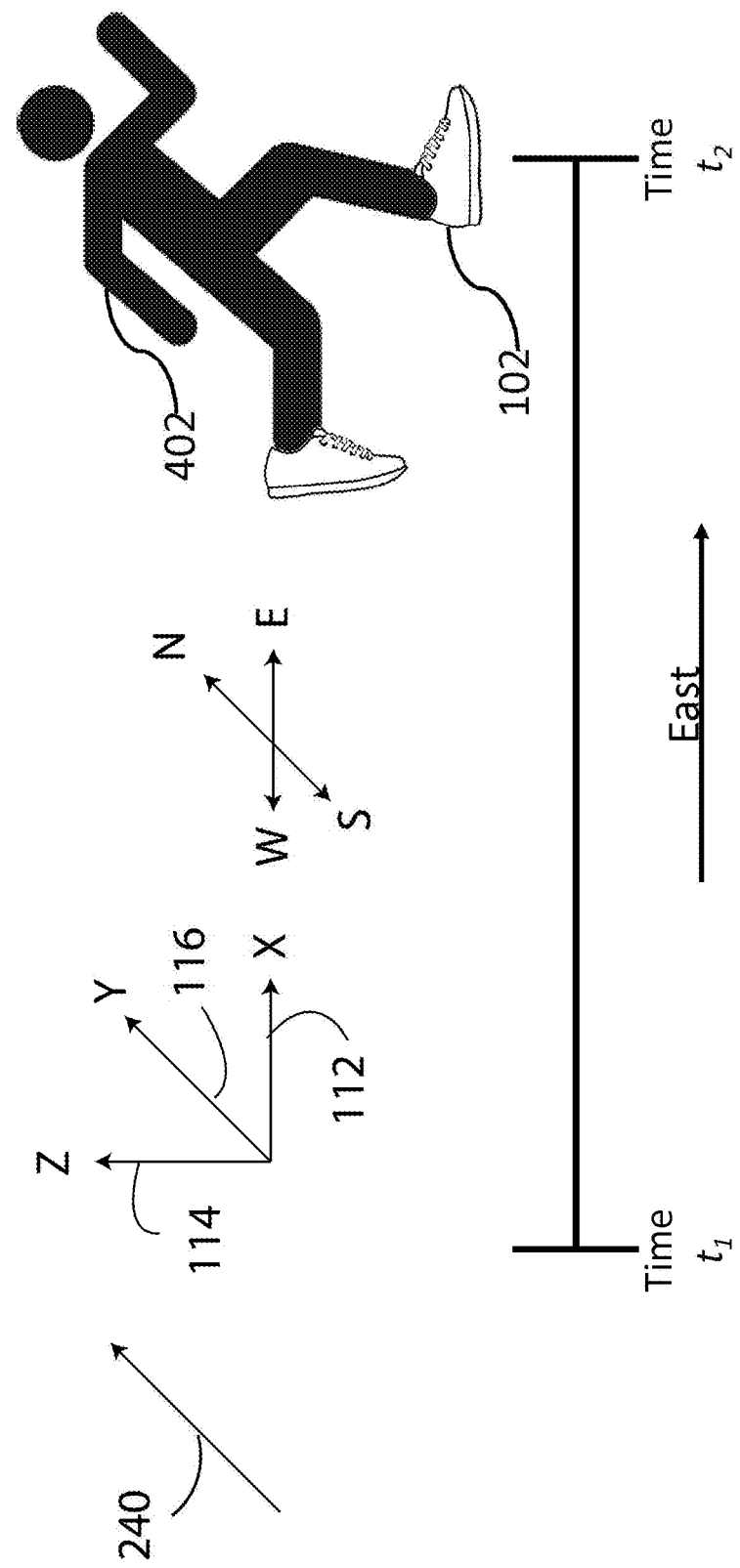

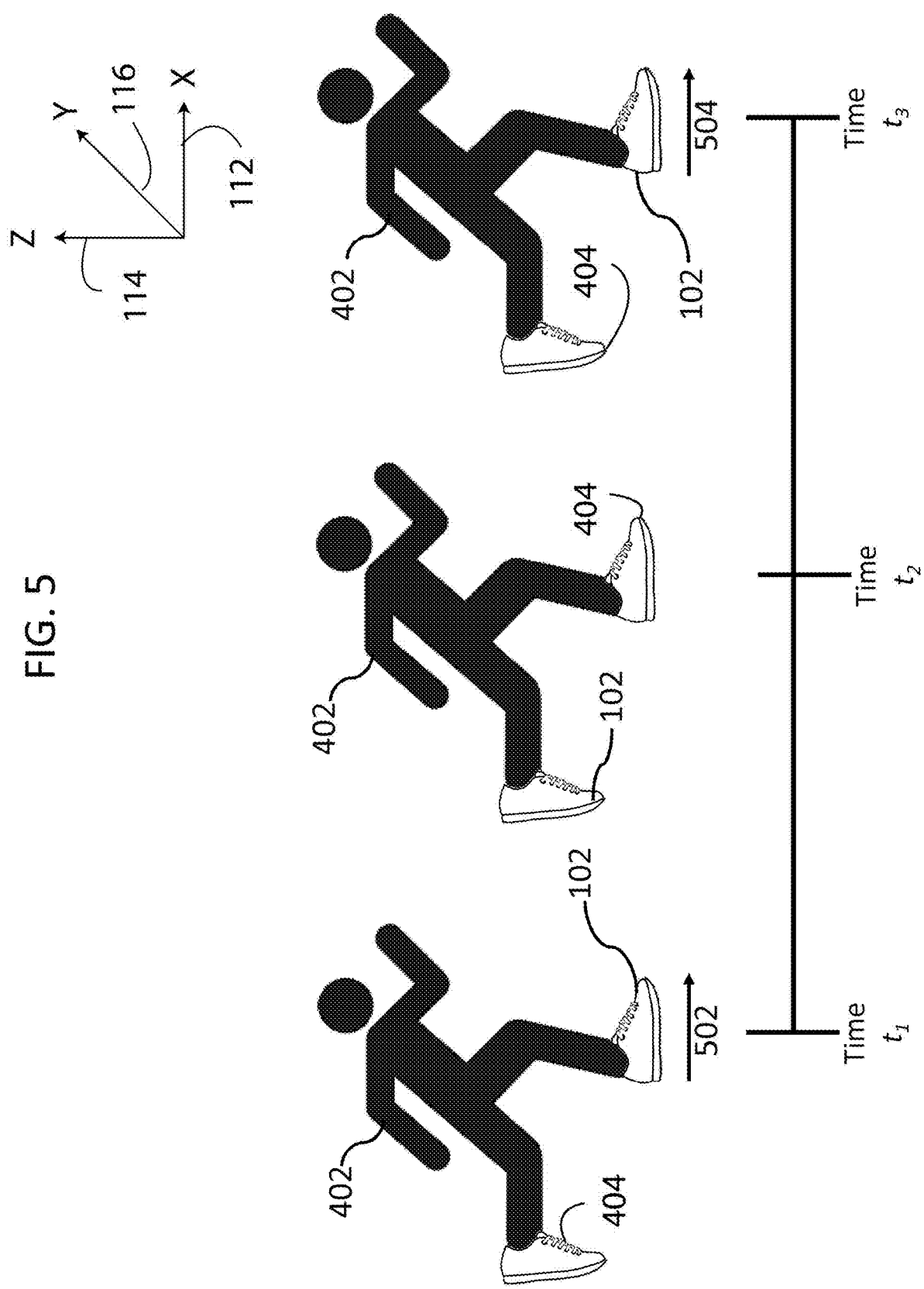

SYSTEM AND METHOD FOR GENERATING ROUTE DATA

CROSS-REFERENCE TO RELATED APPLICATIONS

This document is a continuation of U.S. patent application Ser. No. 16/152,978, filed Oct. 5, 2018, the contents of which are incorporated herein by reference.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

The present invention generally relates to tracking a user's movement during a workout.

There exists a need for a device and method to use an electronic system mounted on a shoe worn by a user in order to provide untethered tracking of the user's movement during the workout.

SUMMARY

According to an exemplary embodiment of the disclosure, a method of generating route data corresponding to a route traversed by a user wearing a shoe, includes generating three-axis direction data in response to movement of the shoe as the user traverses the route with a magnetometer mounted on the shoe, and determining two-axis calibrated direction data based on the three-axis direction data after the user traverses the route with a controller operably connected to the magnetometer. The two-axis calibrated direction data corresponds to an orientation of the shoe. The method further includes generating acceleration data with an accelerometer mounted on the shoe as the user traverses the route, and determining route data corresponding to the route by processing the acceleration data and the two-axis calibrated direction data with the controller.

According to another exemplary embodiment of the disclosure, a fitness tracking system includes a shoe, a magnetometer and an accelerometer mounted on the shoe, and a controller operably coupled to the magnetometer and the accelerometer. The magnetometer is configured to generate three-axis direction data in response to movement of the shoe during a predetermined time period. The accelerometer is configured to generate acceleration data corresponding to acceleration of the shoe during the predetermined time period. The controller is configured to (i) generate two-axis direction data based on the three-axis direction data after the predetermined time period, the two-axis direction data corresponding to an orientation of the shoe during the predetermined time period, and (ii) process the two-axis direction data and the acceleration data to generate route data corresponding to traversal of a route by a user of the shoe during the predetermined time period.

According to yet another exemplary embodiment of the disclosure a method is disclosed for generating route data corresponding to a route traversed by a user with a magnetometer mounted on a shoe. The method comprises receiving three-axis direction data generated by the magnetometer during a predetermined time period during which the shoe is in motion. The method further comprises generating two-axis direction data based on the three-axis direction data after the predetermined time period, the two-axis direction data corresponding to the orientation of the shoe during the predetermined time period. Thereafter, the method comprises generating route data corresponding to a route traversed by a user wearing a shoe, wherein the route data is based at least in part on the two-axis direction data.

BRIEF DESCRIPTION OF THE DRAWINGS

The accompanying drawings, which are incorporated in and form a part of the specification, illustrate example embodiments and, together with the description, serve to explain the principles of the invention. In the drawings:

FIG. 2 illustrates a block diagram of the electrical assembly in accordance with aspects of the present invention;

FIG. 4A illustrates a process of tracking a direction of movement of a user at a first time in accordance with aspects of the present invention;

FIG. 4B illustrates a process of tracking the direction of movement of the user at a second time in accordance with aspects of the present invention;

FIG. 5 illustrates a process of tracking an acceleration of a user in accordance with aspects of the present invention;

Figure 1:
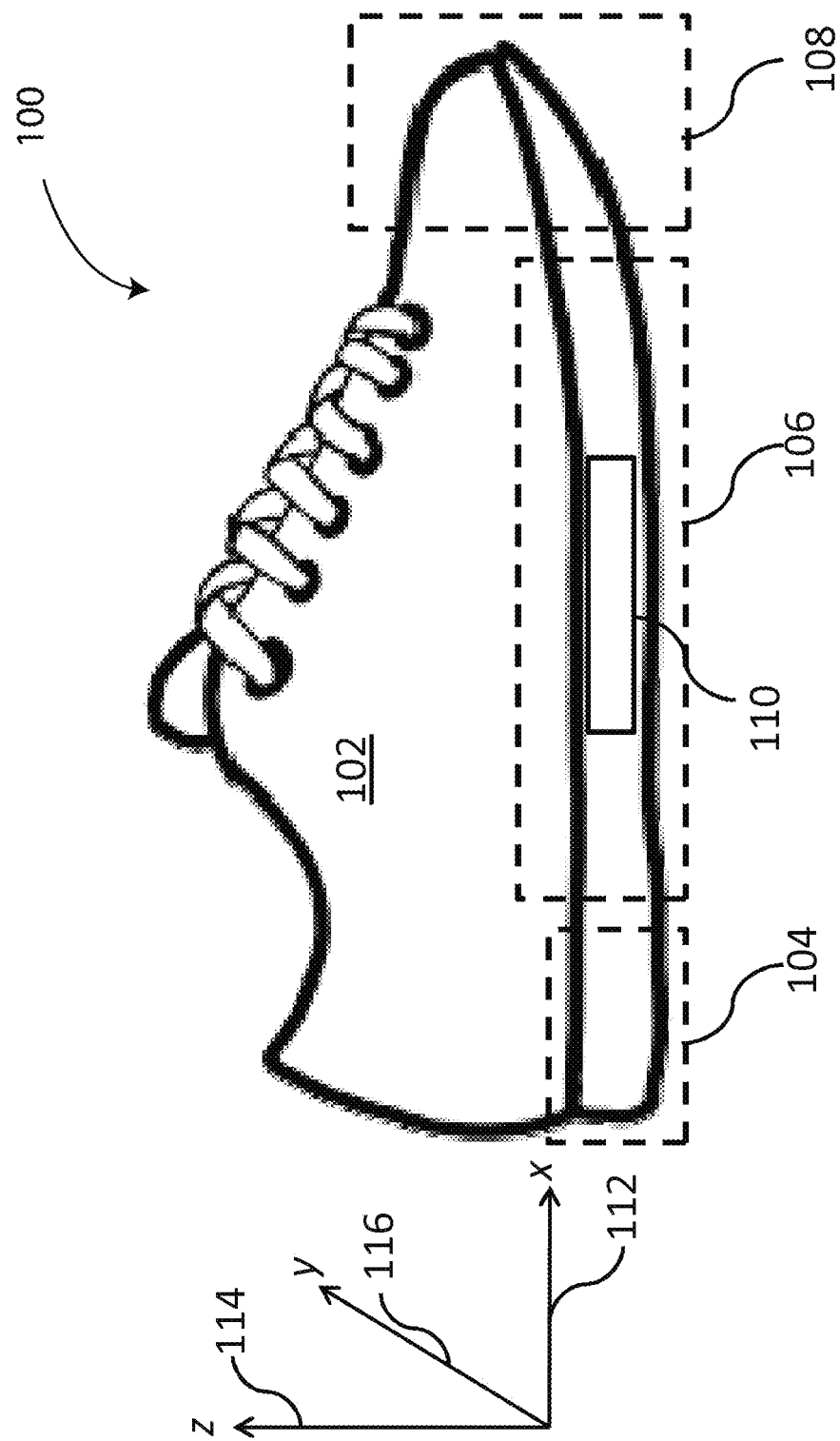
FIG. 1 illustrates a fitness tracking system including a shoe in accordance with aspects of the present invention, the shoe includes an electrical assembly.

All Figures © Under Armour, Inc. 2018. All rights reserved.

DETAILED DESCRIPTION

Overview

A shoe includes: a heel portion; a toe portion; a sole portion; and an electrical assembly. The electrical assembly includes at least: a magnetometer configured to determine a direction or an orientation of the shoe; and an accelerometer configured to determine acceleration of the shoe. Direction data generated by the magnetometer is calibrated after use of the shoe. The calibrated direction data and movement data based on the acceleration data are used to generate a display of a route traversed by a wearer of the shoe on a user interface of an electronic device that is separate from the shoe.

These and other aspects of the invention shall become apparent when considered in light of the disclosure provided herein.

Example Embodiments

Aspects of the present invention are drawn to a system and method for using an accelerometer and magnetometer in a shoe in order to provide untethered tracking of a user's workout by monitoring the user's movement while running, walking, or jogging. As used herein the term "running" encompassing all types of bipedal movement.

Untethered Tracking and Route Data Generation

Typically, in order to track a user's movement while running, an electronic device, such as a smartphone, that receives signals from a satellite-based positioning system (e.g. the Global Positioning System ("GPS")), is used to generate satellite-based location data. Carrying a smartphone in order to track a user's movement while running is quite cumbersome, as it must be carried for the duration of the run. There are several other disadvantages associated with carrying a smartphone while running, such as a detriment to a user's form and potential harm to the device. Since a person can only carry so many things while running, tracking a run may come at a cost of being unable to carry something else, such as a water bottle or keys. Additionally, if a smartphone device is dropped while running, it may be quite expensive to replace or repair.

In accordance with aspects of the present invention, an electrical assembly including an accelerometer, a magnetometer, and a transceiver are disposed in a shoe that is worn by a user while running in order to provide untethered tracking of the user's movement during a workout session. The small size and light weight of the electrical assembly makes the electrical assembly unnoticeable and/or undetectable by the user during the run, such that the user experiences no detriment in form. As used herein, the term "untethered tracking" refers to the user being separated from her smartphone, smartwatch, computer, or other such electronic device while engaged in the run or the workout session. During untethered tracking the user may be miles apart from her smartphone, and, in some instances, the electrical assembly disposed in the shoe is the only battery-powered device with the user during the workout session.

The accelerometer and the magnetometer in the shoe enable untethered tracking of the user's movements without using satellite-based location data to track the user's location. As used herein, satellite-based location data include data from all types of satellite-based positioning systems and/or global navigation satellite systems ("GNSS"). Exemplary systems include GPS, Global Navigation Satellite System ("GLONASS"), and Galileo. As a result, the user may decide to run with only the electrical assembly in the shoe and to leave behind her smartphone or other satellite-based location device. After the workout session, an electronic device is used to retrieve movement data and direction data collected during the run by using the transceiver in the shoe to wirelessly transmit the data to the electronic device. At least one of the electronic device and the electrical assembly in the shoe processes the movement data and the direction data to determine route data corresponding to the user's route taken during the workout session. If the electrical system is configured to determine the route data, then the route data are also transmitted from the electrical system to the electronic device using the transceiver of the electrical system. In one embodiment, the electronic device includes a display screen and is configured to overlay the route data on a map for viewing. Accordingly, using the shoe including the electrical system, the user is able to track her movement while remaining untethered from a satellite-based location device (i.e. smartphone), for example, thereby increasing the convenience of going for a location tracked run. Aspects of the present invention will now be described with reference to the figures.

FIG. 1 illustrates a fitness tracking system 100 including a shoe 102 in accordance with aspects of the present invention. The shoe 102 is shown relative to an x-axis 112, a z-axis 114, and a y-axis 116. The x-axis 112 is parallel to a longitudinal axis of the shoe 102. The z-axis 114 is disposed normal (i.e. perpendicular) to the sole portion 106 and the longitudinal axis of the shoe 102. The y-axis 116 is disposed perpendicularly to a plane defined by the x-axis 112 and the z-axis 114.

The shoe 102 includes a heel portion 104, a sole portion 106, a toe portion 108, and an electrical assembly 110 embedded within the sole portion 106. The heel portion 104 is arranged along the x-axis 112. The sole portion 106 extends from the heel portion 104 and is also arranged along the x-axis 112. The toe portion 104 is arranged along the x-axis 112 and extends from the sole portion 106. The sole portion 106 is disposed between the heel portion 104 and the toe portion 108.

With reference to FIG. 2, the electrical assembly 110, which is also referred to herein as a shoe pod, is configured to track the movement and the orientation (i.e. direction) of a user wearing the shoe 102. The electrical assembly 110 includes a magnetometer 202, an accelerometer 204, a transceiver 206, a temperature sensor 212, and a memory 208 each operably connected to a controller 210. The magnetometer 202 is embedded in the shoe 102 and/or mounted on the shoe 102 and is configured to determine an orientation and/or a direction of the shoe 102 (and the user wearing the shoe 102) based on a detected magnetic field. Moreover, the magnetometer 202 is configured to generate corresponding direction data 218 that are stored in the memory 208. To this end, the magnetometer 202 is fixedly mounted to the shoe 102 in a known orientation. For example, with reference to the coordinate system shown in FIG. 1, the magnetometer 202 is positioned in a "right" shoe 102, such that the positive direction on the x-axis 112 points towards the toe portion 108, the negative direction on the x-axis 112 points towards the heel portion 104, and the positive direction on the y-axis 116 points toward a left shoe (not shown) that may or may not also include a corresponding electrical system 110. The magnetometer 202 is further positioned such that the positive direction in the z-axis 114 points towards the wearer's head. Any other orientation of the magnetometer 202 is also possible so long as the orientation is known to the controller 210. As mentioned above, in other embodiments, both the user's left shoe and right shoe each include a corresponding electrical assembly 110 so that the orientation of both shoes is tracked.

The magnetometer 202 is configured to detect a change in the direction of movement of the user based on a change in the detected magnetic field. In one embodiment, the magnetometer 202 is a tri-axial device and the direction data 218 generated by the magnetometer 202 includes three-axis (i.e. three variable) direction data points based on the magnetic field strength detected by the magnetometer 202. Specifically, in at least some embodiments, the magnetometer 202 generates magnetic field data based on the change in the detected magnetic field. The magnetic field data are converted into the direction data 218. The conversion of the magnetic field data into the direction data 218 is performed by the magnetometer 202 and/or any other element of the system 100 by way of mathematical operations and/or any other processing steps.

The direction data 218 generated by the magnetometer 202, in some embodiments, includes foot strike data 222 that are based on a pronation and/or a supination of the user's foot. In particular, if the shoe 102 moves out of a plane defined by the x-axis 112 and the z-axis 114, it is typically due to rotation of the user's foot about the ankle in an inward direction (supination) or an outward direction (pronation). Typically, there is naturally a bit of supination and pronation in a user's gait cycle when running or walking, but too much of either supination or pronation may lead to injuries or damage to various parts of the foot over the long term. By evaluating the foot strike data 222 the user may prevent injuries and/or unnatural wear on their joints by taking action to correct excessive supination or excessive pronation that may occur while running.

As shown in FIG. 2, the accelerometer 204 is embedded in the shoe 102 and/or mounted on the shoe 102 and is configured to detect acceleration of the shoe 102, which includes detecting a ground contact acceleration. The accelerometer 204 detects the ground contact acceleration as a comparatively large impulse of acceleration that occurs when the user strikes the ground with the shoe 102. The accelerometer 204 is configured to generate an electrical ground contact signal based on the detected ground contact acceleration.

In one embodiment, the accelerometer 204 is a tri-axial device that collects three-axis acceleration data 230 corresponding to the detected acceleration of the shoe 102 and the ground contact acceleration. The acceleration data 230 are processed by the controller 210 to generate movement data 232, which may include speed data, cadence data, stride length data, distance data, and/or ground contact time data.

The speed data of the movement data 232 corresponds to a speed of the user as the user moves while wearing the shoe 102. The cadence data of the movement data 232 corresponds to the number of steps taken per unit time (e.g. steps per minute) of the user as the user moves while wearing the shoe 102. The stride length data of the movement data 232 corresponds to a length of each stride taken by the user as the user moves while wearing the shoe 102. The stride length data may include an average stride length of the user. The distance data of the movement data 232 corresponds to a distance traversed by the user while wearing the shoe 102. The ground contact time data of the movement data 232 corresponds to a length of time that the shoe 102 is in contact with the ground during movement of the user while wearing the shoe 102.

Figure 6:
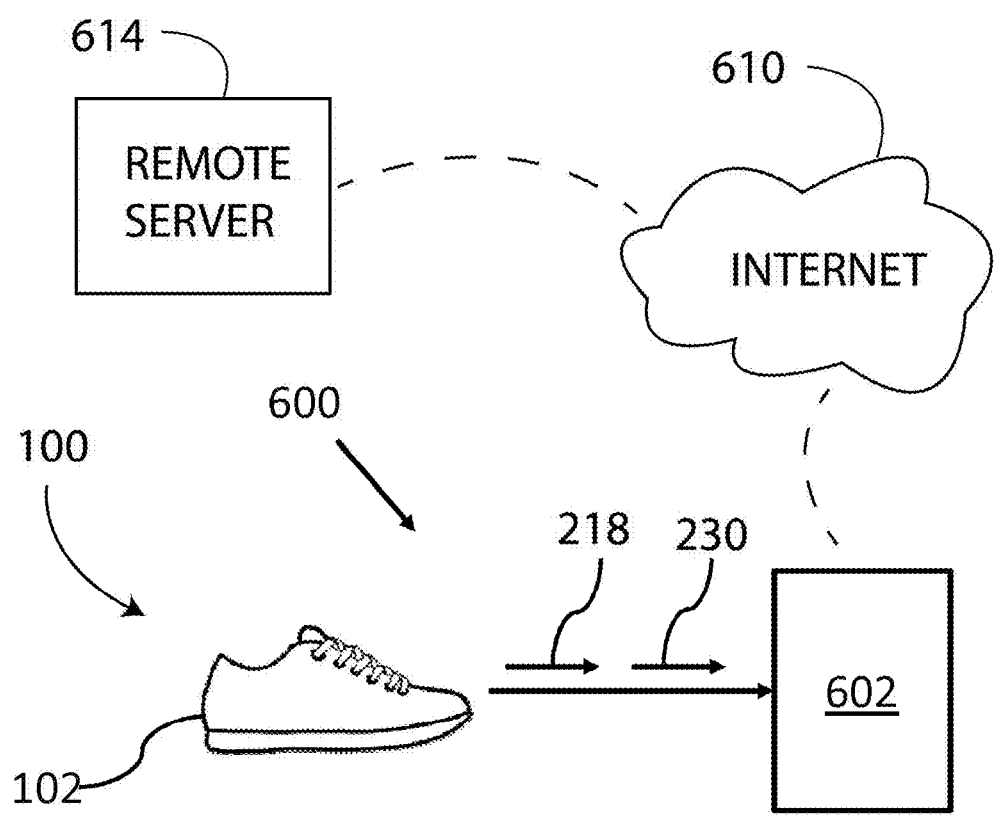
FIG. 6 illustrates the fitness tracking system in electrical communication with an electronic device, the Internet, and a remote server in accordance with aspects of the present invention.

The transceiver 206 of FIG. 2 is configured to transmit the direction data 218 and the movement data 232 from the electrical assembly 110 to an electronic device, such as electronic device 602 in FIG. 6, for example. The electronic device may comprise any computerized apparatus operably connected to the electrical system 110. Non-limiting examples of the electronic device include a smartphone, a tablet, a laptop, a desktop computer, a smart watch, etc.

In one embodiment, the transceiver 206 is configured for operation according to the Bluetooth® wireless data transmission standard. In other embodiments, the transceiver 206 comprises any desired transceiver configured to wirelessly transmit and receive data using a protocol including, but not limited to, Near Field Communication ("NFC"), IEEE 802.11, Global System for Mobiles ("GSM"), and Code Division Multiple Access ("CDMA").

The temperature sensor 212 is operably connected to the controller 210 and is configured to sense a temperature of the electrical system 110 and the shoe 102. Specifically, the temperature sensor 212 senses a temperature of the magnetometer 202 or near the magnetometer 202. In some embodiments, the data generated by the magnetometer are calibrated based on the temperature sensed by the temperature sensor 212.

Figure 7:
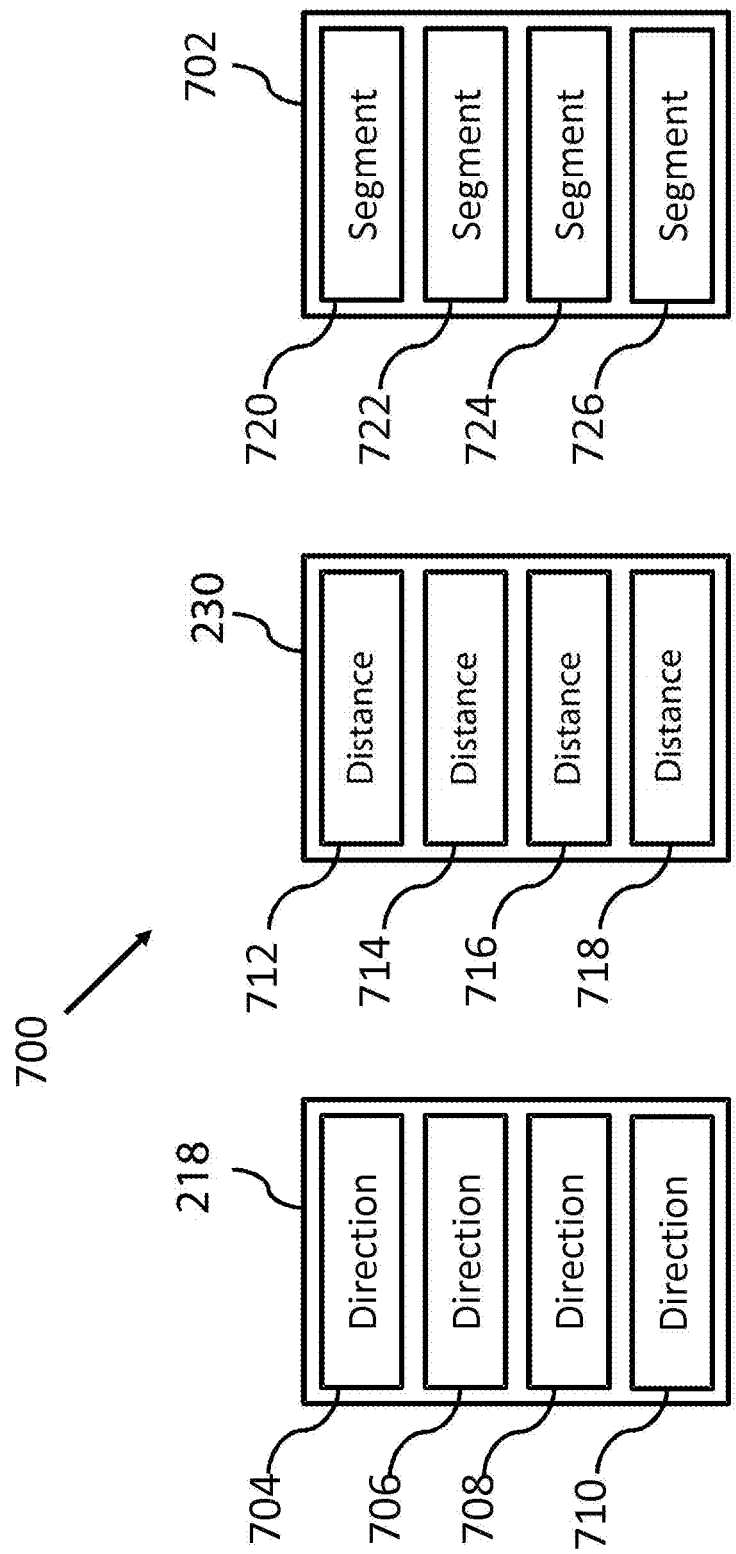
FIG. 7 illustrates a data processing technique configured to generate route data in accordance with aspects of the present invention.

The memory 208 of the electrical system 110 is an electronic data storage unit, which is also referred to herein as a non-transient computer readable medium. The memory 208 is configured to store the direction data 218, the acceleration data 230, the movement data 232, and any other electronic data associated with the electrical system 110, such as route data 702 (FIG. 7).

The controller 210 of the electrical system 110 is configured to execute program instructions for controlling the magnetometer 202, the accelerometer 204, the transceiver 206, and the memory 208. The controller 210 is configured as a microprocessor, a processor, or any other type of electronic control chip.

Figure 3:
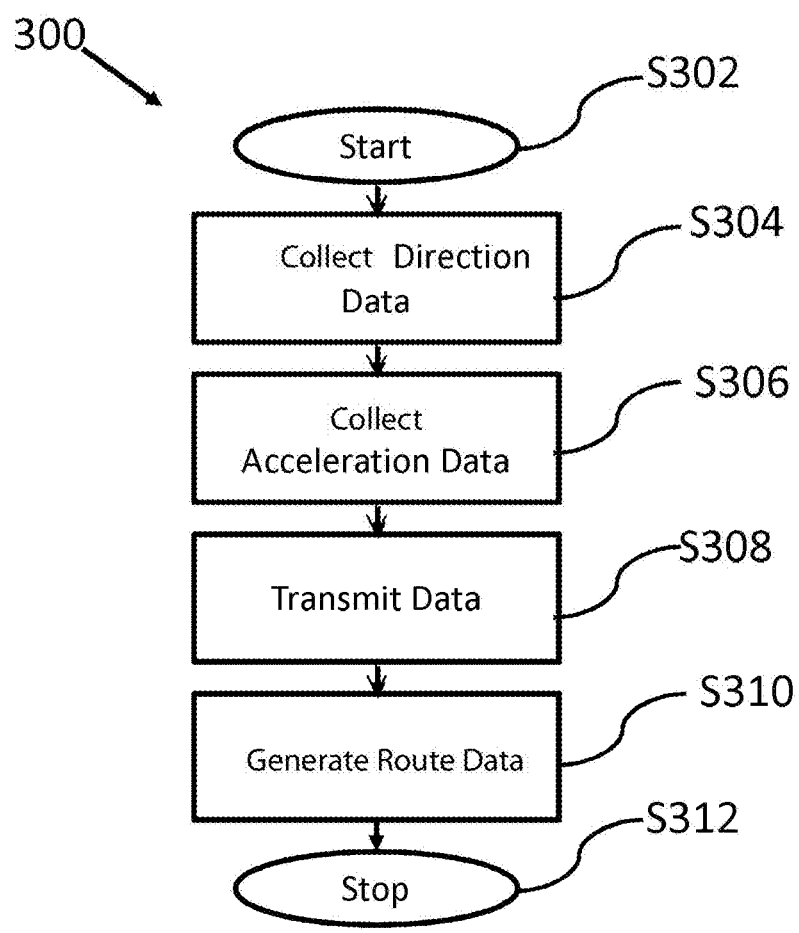
FIG. 3 illustrates a flowchart of an exemplary method of operating the fitness tracking system in accordance with aspects of the present invention.

An example method 300 for determining and tracking a user's movement while running is described with reference to the flowchart of FIG. 3 as well as FIGS. 4A, 4B, 5, and 6. The method 300 of FIG. 3 starts (S302) with user 402 wearing the shoe 102. The user 402 wearing the shoe 102 is illustrated in FIG. 4A. In this example, the user 402 is engaged in untethered tracking, thus, the user 402 is not carrying a smartphone or other satellite-based location device. As a result, the user 402 benefits from the tracking capabilities of the electrical system 110 without being burdened by bringing along a smartphone or other bulky electronic device.

As the user runs and moves the shoe 102, the electrical system 110 collects the direction data 218 generated by the magnetometer 202, and stores the direction data 218 in the memory 208 (S304). For example, in FIG. 4A at time $t_1$ the user 402 begins running and the magnetometer 202 generates a three-axis direction data point based on a magnetic field 240. In this example, the magnetic field 240 is generated by the Earth and points towards magnetic north. The exemplary direction data point generated by the magnetometer 202 is (0,1,0) in a format corresponding to (x-axis 112, y-axis 116, z-axis 114). The direction data point is stored in the memory 208 as the direction data 218.

Based on the direction data point, the controller 210 determines the orientation of the shoe 102 relative to the Earth's magnetic field (i.e. relative to the detected magnetic field 240). In particular, the magnetic field 240 points towards magnetic north, which in this example coincides with directional north, as shown in FIG. 4A. The controller 210 determines that the magnetic field 240 is aligned with the y-axis 116 since only the value of the direction data point corresponding to the y-axis 116 has a magnitude greater than zero. Moreover, the controller 210 determines that since the y-axis value is positive (i.e. +1), directional north points in the positive direction of the y-axis 116. Knowing that the x-axis 112 is perpendicular to the y-axis 116 and that the toe portion 108 points in the positive direction of the x-axis 112, the controller 210 further determines that the toe portion 108 of the shoe 102 is pointing towards the east. Thus, from only the three-axis direction data point of the direction data 218 determined by the magnetometer 202 and the known orientation of the magnetometer 202 relative to the shoe 102, the controller 210 determines that the user 402 wearing the shoe 102 is facing towards the east at time $t_1$.

Next, as shown in FIG. 4B, the user 402 has moved in an easterly direction and at time $t_2$, the user 402 turns and runs in a northward direction. The user 402 is shown in FIG. 4B facing to the east prior to turning to the north. After the user 402 turns to the north, the magnetometer 202 detects a change in the magnetic field 240, and the magnetometer 202 generates another three-axis direction data point of the direction data 218. For example, the direction data point generated at time $t_2$ after the user 402 turns to the north is (1,0,0) and indicates that the orientation change of the user 402 and the shoe 102 has caused the x-axis 112 to become aligned with the magnetic field 240 instead of the y-axis 116. Using the approach set forth above, the controller 210 determines that based on the direction data point and the known orientation of the magnetometer 202 in the shoe 102, that the toe portion 108 of the shoe 102 is pointing towards the north and the user 402 wearing the shoe 102 is facing towards the north. In some embodiments, the direction data 218 are time stamped so that the direction data 218 can be matched to corresponding movement data 232 and/or acceleration data 230.

The controller 210 continues to collect the direction data 218 in the form of the three-axis direction data points based on the magnetic field 240 detected by the magnetometer 202. In this example embodiment, the direction data 218 determined by magnetometer 202 only includes the direction and/or the orientation of the shoe 102 and the user 402. In order to determine if the user 402 is moving in the determined direction/orientation, the controller 210 collects the acceleration data 230 (S306) and generates the movement data 232.

As shown in FIG. 5, in collecting the acceleration data 230 (S306), suppose that the user 402 takes a step and the shoe 102 contacts the ground at the end of the step at time $t_1$. When the shoe 102 contacts the ground, the z-axis 114 is normal to the ground, the sole portion 106, and the electrical assembly 110. Moreover, when the shoe 102 contacts the ground, the accelerometer 204 detects a change in acceleration along the z-axis 114 as the shoe 102 abruptly stops moving downward. The accelerometer 204 registers the change in acceleration along the z-axis 114 as the completion of a step and generates a corresponding ground contact signal 502. The ground contact signal 502 and the magnitude of the acceleration detected by the accelerometer 204 are at least temporarily saved to the memory 208 as the acceleration data 230. Accordingly, based on the ground contact signal 502, the controller 210 is configured to determine when the shoe 102 is positioned on the ground during a stride of the user.

After the shoe 102 contacts the ground, the accelerometer 204 detects the acceleration of the shoe 102 as the user 402 takes another step from time $t_1$ to time $t_2$. At time $t_2$, the user 402 has contacted the ground with their other shoe 404 and the accelerometer 204 has continually detected acceleration of the shoe 102. The other shoe 404 may or may not include the electrical system 110.

As the user 402 contacts the ground with the other shoe 404 at time $t_2$, they begin to raise the shoe 102 in preparation for taking a further step, which is detected as an acceleration along z-axis 114 by the accelerometer 204. After contacting the ground with the other shoe 404, the user 402 begins to move the shoe 102 forward to take another step. At time $t_3$, the shoe 102 contacts the ground again, and the user 402 has completed a further step. Thus, FIG. 5 illustrates the end of a first step with the shoe 102 at time $t_1$, the end of a second step with the other shoe 404 at time $t_2$, and the end of a third step with the shoe 102 at time $t_3$.

When the shoe 102 contacts the ground at time $t_3$, the accelerometer 204 detects the change in acceleration along z-axis 114 and generates a further ground contact signal 504. After the ground contact signals 502, 504 are generated, enough acceleration data 230 has been generated in order for the controller 210 to generate the movement data 232 and to track the movement of the user 402. For example, after at least two ground contact signals 502, 504 are generated by the accelerometer 204, the controller 210 typically has enough acceleration data 230 to calculate the speed of the user 402. And once speed is known, the controller 210 has enough data to determine a distance traveled for a given step, according to known approaches. Moreover, the controller 210 processes the acceleration data 230 to determine other aspects of the movement data 232 including the cadence data, the stride length data, the distance data, and/or the ground contact time data, also according to known approaches.

The movement data 232 are stored in the memory 208. In at least some embodiments, the movement data 232 and/or the acceleration data 230 are time stamped so as to be correlated to the direction data 218 generated by the magnetometer 202, which may also be time stamped. In this example embodiment, the movement data 232 also includes an average acceleration between each step of the shoe 102 and a total time between the ground contact signal 502 and the ground contact signal 504. For each new ground contact signal 502, 504 that is generated based on the acceleration data 230, the controller 210 tracks and stores related movement data 232.

In some embodiments, the controller 210 processes the movement data 232 to determine when the direction data 218 should be collected. For example, the controller 210 may be configured to collect the direction data 218 only when the shoe 102 is positioned on the ground as determined based on the movement data 232. Whereas, in other embodiments, the controller 210 is configured to continually collect the direction data 218 and to separately identify the direction data 218 generated when the shoe 102 is on the ground as a subset of the direction data 218.

With reference to FIG. 6, after the user 402 has completed the run, the fitness tracking system 100 determines details related to the run including distance, time, and location. In one embodiment, a transmission system 600 is configured to transfer the data generated by the electrical system 110 from the shoe 102 to an electronic device 602. The transmission system 600 includes the shoe 102 and the electronic device 602 and may also include the Internet 610 and a remote server 614. The electronic device 602 is operable to wirelessly communicate with the transceiver 206 of the shoe 102. In this non-limiting exemplary embodiment, the electronic device 602 is a smartphone 602. In other embodiments, the electronic device 602 may be a desktop computer, laptop computer, tablet, or the like.

After the direction data 218 are collected and the acceleration data 230 are processed to determine the movement data 232, the direction data 218 and the movement data 232 are transmitted (S308) from the shoe 102 to the smartphone 602. For example, as shown in FIG. 6, after the user 402 finishes the run, the user 402 electronically connects the smartphone 602 to the transceiver 206 of the shoe 102. Once connected, the transceiver 206 transmits the direction data 218, the movement data 232, and any other pertinent data stored in the memory 208 to the smartphone 602. In some embodiments, the smartphone 602 transmits the direction data 218 and the movement data 232 to the remote server 614 using the Internet 610.

Next, the smartphone 602 or the remote server 614 processes the direction data 218 and the movement data 232 in order to generate the route data 702 (FIG. 7) corresponding to the route taken by the user during the run. The route data 702 may be displayed on a visual interface (i.e. a display screen) of the smartphone 602. For example, the smartphone 602 may overlay the route data 702 on a map or satellite imagery to illustrate the route to the user 402.

Figure 8:
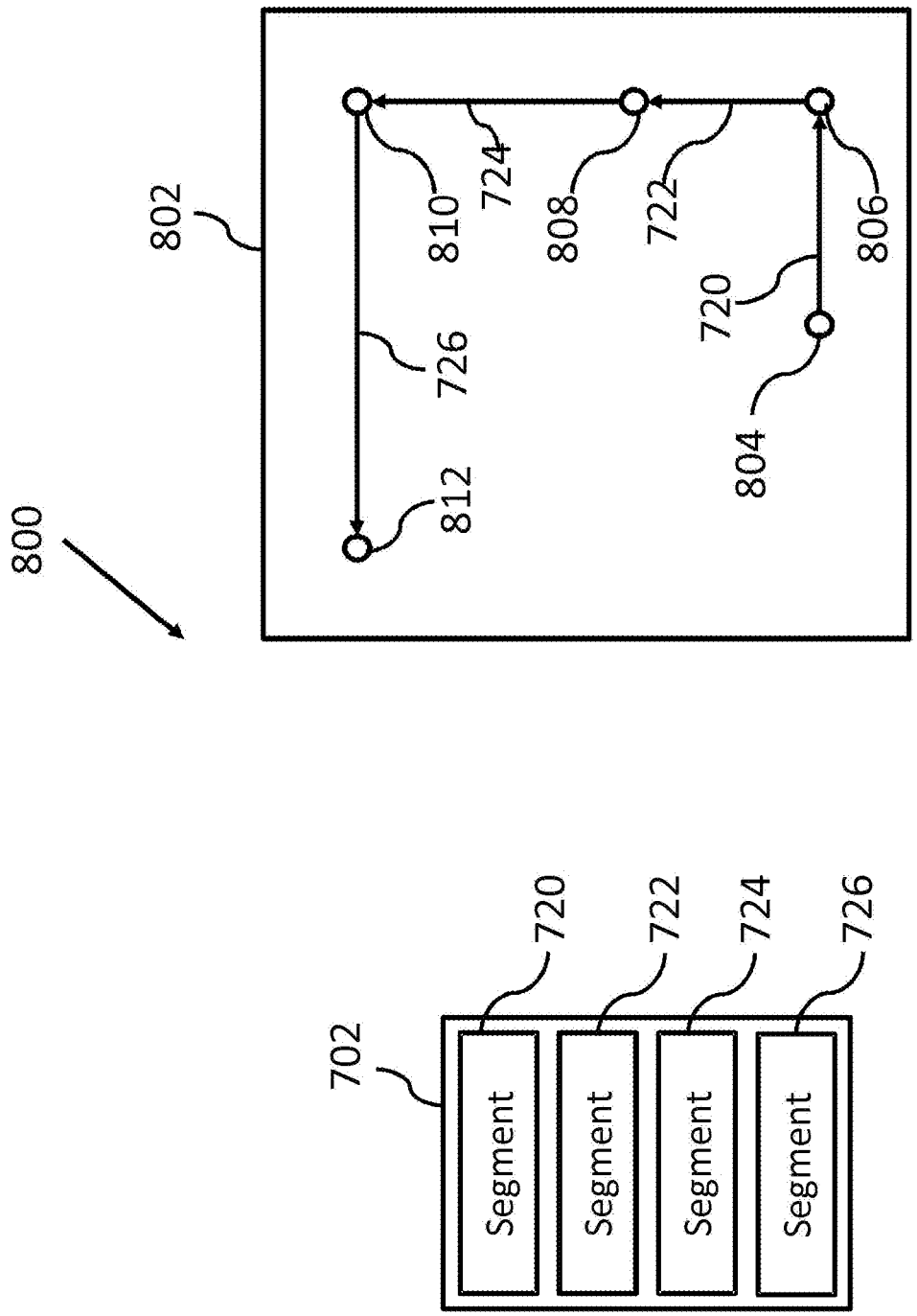
FIG. 8 illustrates the route data generated according to the data processing technique of FIG. 7.

The processing of data by the smartphone 602 is further discussed with additional reference to FIGS. 7 and 8. FIG. 7 illustrates a data processing system 700 in accordance with aspects of the present invention. As shown in FIG. 7, the data processing system 700 includes the direction data 218, a subset of the movement data 232 shown as the distance data 230, and the route data 702. In this embodiment, the direction data 218 further includes direction chunk 704, direction chunk 706, direction chunk 708, and direction chunk 710. The distance data 230, in this embodiment, includes distance chunk 712, distance chunk 714, distance chunk 716, and distance chunk 718. The route data 702 includes segment chunk 720, segment chunk 722, segment chunk 724, and segment chunk 726.

In order to generate the route data 702, the smartphone 602 uses the direction data 218 and the distance data 230 to generate a corresponding segment chunk. To begin, the smartphone 602 evaluates the direction chunk 704 and the distance chunk 712 in order to generate the segment chunk 720. Suppose that in this example, the direction chunk 704 indicates that the user 402 was running east and that the corresponding distance chunk 712 indicates that the user 402 moved 1 meter. Based on this information, the smartphone 602 generates the segment chunk 720, which indicates that the user 402 ran east for a distance of 1 meter.

After the segment chunk 720 is generated, it is stored within the route data 702 as a segment, a "leg," or a portion of the route taken by the user 402 during the run. Next, the smartphone 602 continues generating the segments of the route data 702 by processing the direction chunk 706 and the distance chunk 714. Suppose that in this example, the direction chunk 704 indicates that the user 402 moved 1 meter. Based on this information, the smartphone 602 generates and stores the segment chunk 720 of the route data 702, which indicates that the user 402 ran north for a distance of 1 meter.

The smartphone 602 generates segment chunks of the route data 702 until all of the direction data 218 and the distance data 230 has been processed. Next, the smartphone 602 generates the segment chunk 724 based on the direction chunk 708 and the distance chunk 716, and generates the segment chunk 726 based on the direction chunk 710 and the distance chunk 718. Suppose that in this example, the segment chunk 724 indicates that user 402 ran north for 1.5 meters and that segment chunk 726 indicates that user 402 ran west for 2.0 meters.

With reference to FIG. 8, after the direction data 218 and the distance data 230 has been processed to generate the route data 702, the smartphone 602 uses the segment data 702 in order to piece together the route traversed by the user 402 during the run. In FIG. 8, a system 800 is shown in which the route data 702 are visualized on a display 802 and includes a starting point 804, a point 806, a point 808, a point 810, and a point 812.

In this example, the display 802 is provided on a user interface of the smartphone 602, for example. The smartphone 602 evaluates the first segment chunk 720 of the route data 702 and illustrates a line from the starting point 804 to the point 806 based on the length and the direction of the segment chunk 720. In this simplified example embodiment, the point 806 is 1.0 meter east of the starting point 804. The smartphone 602 also illustrates a line from the point 806 to the point 808 based on the length and the direction of the segment chunk 722. In this example embodiment, the point 808 is 1.0 meter north of the point 806. The smartphone 602 illustrates lines between each successive point based on the corresponding segment chunks of the route data 702. In this example embodiment, the point 810 is 1.5 meters north of the point 808 and the point 812 is 2.0 meters west of the point 810. In this manner, the smartphone 602 pieces together the route taken by the user 402 as determined by the electronic device 110. Moreover, in some embodiments, the smartphone 602 overlays the pieced together route data 702 on a map of the area in which the user 402 ran or on satellite imagery of the area in which the user 402 ran based on a known location of the starting point 804, for example.

In the above described embodiment, the smartphone 602 and/or the remote server 614 generates the route data 702. The route data 702 are generated in the "cloud" when generated by the remote server 614. In another embodiment, the electronic device 110 generates the route data 702, and the route data 702 are stored in the memory 208. In such an embodiment, the route data 702 are transmitted to the smartphone 602 by the transceiver 206 for further processing and display.

The apparatus and methods described above may be utilized in the herein-described practical applications.

A shoe may be provided comprising a heel, a toe, a sole, and an electrical assembly. The electrical assembly may comprise a magnetometer configured to determine a direction of movement of the shoe and an accelerometer configured to determine acceleration of the shoe, such as are provided in the discussion above. Using the methods and apparatus discussed herein, the direction and acceleration data are used to generate route data indicating traversal of a route by a wearer of the shoe at a user interface of a user device. In one variant, the electrical assembly further comprises a transceiver apparatus to wirelessly transmit the direction data and movement data, based on the acceleration data, to the user device. The user device and/or the electrical assembly may utilize the direction data and the movement data to determine a distance travelled per stride, which is in turn utilized to generate the route data.

It is further noted that the heel portion of the shoe is separated from the toe by a length along the x-axis and the sole is disposed from the heel to the toe. The z-axis is defined as being normal to the sole and the y-axis is defined as being perpendicular to a plane of the z-axis and the x-axis.

Using these definitions, the magnetometer is further operable to generate change of direction data based on a detected change in a detected magnetic field along the x-axis, y-axis, or z-axis. The change of direction data may then be transmitted to the user device and utilized in the generation of the display of the route data. The magnetometer may further generate foot strike data relating to the shoe based on a detected magnetic field within the plane of the z-axis and the x-axis. Such data may be transmitted to the user device and presented to the user via a user interface thereat.

In addition, the controller may generate a ground contact signal based on a detected ground contact acceleration when the shoe contacts the ground. The magnetometer in this embodiment generates foot strike data based on the ground contact signal. Similarly, the ground contact signal and the foot strike data are transmitted to the user device for display to the user via one or more user interfaces.

A non-transitory computer executable apparatus comprising a plurality of instructions which are configured to, when executed by a processor, enable a user to complete an untethered workout, are also enabled via the herein-disclosed apparatus and methods. Specifically, instructions at an electronic assembly associated to a shoe are provided which cause a magnetometer associated to the shoe (which is worn by the user during the workout) to determine a plurality of direction data relating to a direction of movement of the shoe during the workout, cause an accelerometer associated to the shoe to determine a plurality of acceleration data relating to an acceleration of the shoe during the workout, and cause a transceiver associated to the shoe to transmit the plurality of direction data and a plurality of movement data based on the acceleration data to a user device. In one variant, the user device utilizes the plurality of direction data and movement data to generate a display of a map indicating traversal of a route of the user during the workout.

The herein-disclosed apparatus and methods may enable an application defined by a method for generating a map of a user's workout via only information obtained from an electronic system associated to a shoe worn by the user during the workout. To provide the untethered experience, a plurality of direction data relating to a direction of movement of the shoe during the workout is determined via a magnetometer associated to the shoe. Next, a plurality of acceleration data relating to an acceleration of the shoe during the workout is determined via an accelerometer of the electronic system associated to the shoe. Finally, the plurality of direction data and movement data based on the acceleration data are transmitted to a user device via a transceiver of the electronic system associated to the shoe. The user device utilizes the direction data and the movement data to generate a map of the user's workout, which is displayed to the user via an interface of the user device.

In summary, a problem with the current system and method for tracking a user's movement when running is that it requires them to be tethered to an electronic device. In general, an electronic device such as a smartphone (or other satellite-based location device) is required in order to track a user's movements, which presents several problems. One problem is that running while carrying an electronic device requires the device to physically be carried by the user, possibly at the expensive of another item such as a water bottle or keys. Another problem is that most electronic devices that are used to track movements are expensive, fragile, and expensive to replace.

The present invention removes these problems by eliminating the need for an electronic device altogether. A magnetometer and accelerometer are embedded in a shoe in order to track direction of movement as well as acceleration. After completing a run, a user can then use an electronic device at their convenience to retrieve the data from a transceiver in the shoe.

After retrieving the data, the electronic device can use the direction data and the movement data to create a map for the user. The map can give the user information about distance, time, and speed associated with a run. Additionally, the magnetometer can simultaneously track foot strike data, including pronation data and/or supination data that may be utilized to evaluate form or problems that occur while running.

The herein described applications improve the functioning of the user device and/or the shoe pod by enabling these devices to associate a user's workout to a map of a route thereof via collected acceleration and magnetometer data. Devices that are able to utilize acceleration and magnetometer data to provide a means for determining a user's route as disclosed herein can operate to more efficiently enable an untethered workout experience.

Calibration of Direction Data Generated by the Magnetometer

Figure 9:
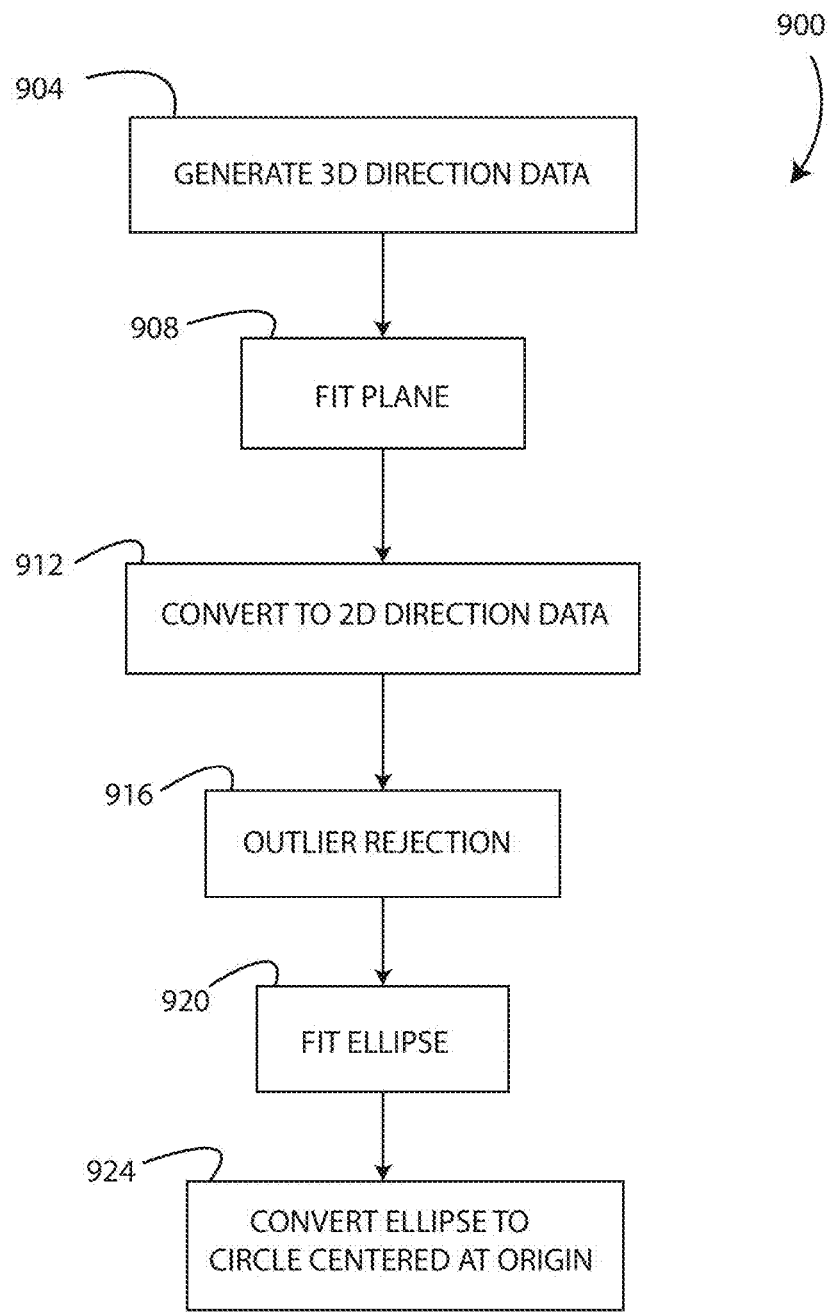
FIG. 9 illustrates a flowchart of an exemplary method of calibrating direction data generated by the fitness tracking system in accordance with aspects of the present invention.
Figure 10:
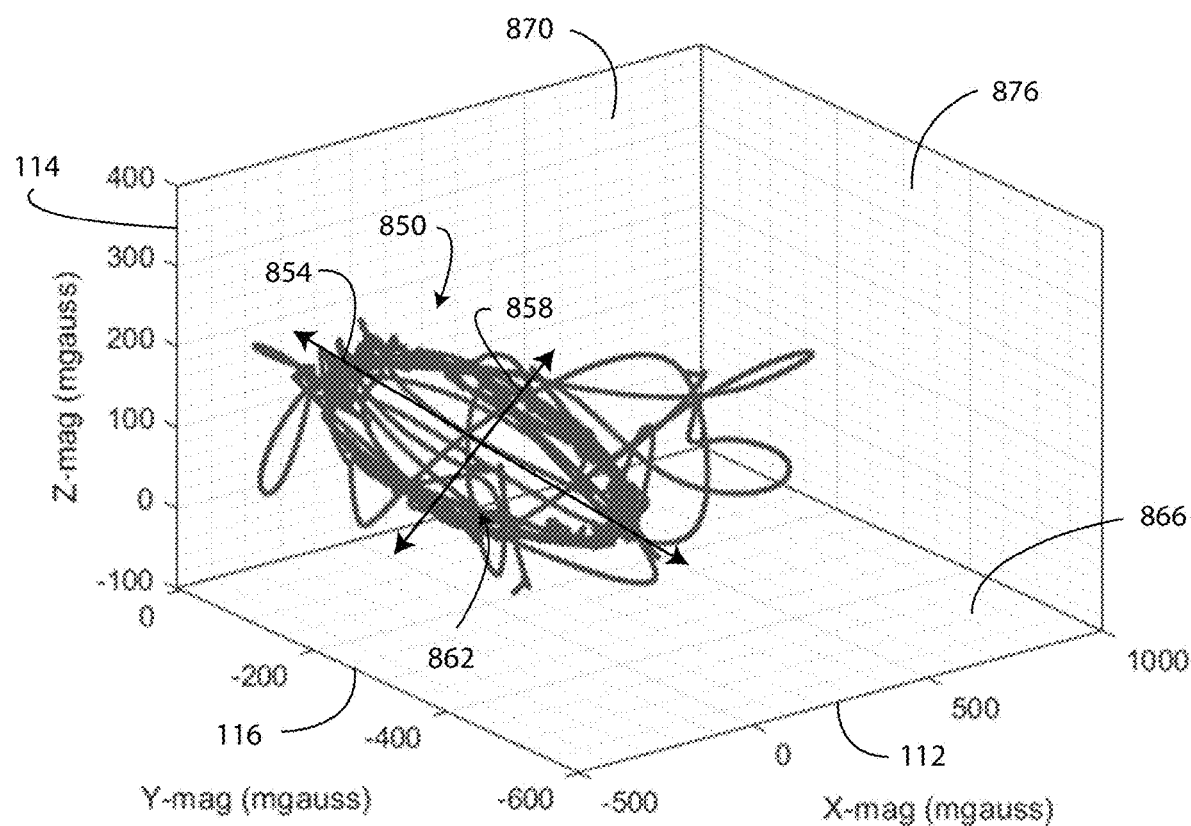
FIG. 10 illustrates a plot of three-axis uncalibrated direction data generated by the fitness tracking system in accordance with aspects of the present invention.

As shown in FIG. 9, the direction data 218 generated by the magnetometer 202 are calibrated according to a calibration method 900. With reference to block 904, the method 900 includes generating and/or collecting the direction data 218 with the magnetometer 202 as the user runs while wearing the shoe 102. The direction data 218 generated by the magnetometer 202 typically requires calibration before the direction data 218 and the movement data 230 are processed to generate the route data 702. For example, FIG. 10 illustrates a plot of uncalibrated three-axis direction data 850 generated by the magnetometer 202 in response to movement of the shoe 102. The data 850 in FIG. 10 are uncalibrated but have been smoothed in order to improve the accuracy of the direction data 850 and to facilitate a clear illustration of the data 850. Moreover, the data 850 are shown with a line passing through each data point in the order in which the data points were generated.

The uncalibrated direction data 850 of FIG. 10, includes three-axis data points that are arranged in a shape that is generally elliptical. The direction data 850 forms a generally elliptical shape because often users run a looped route that starts and ends in the same location. Because the route is looped, over the course of the route, the shoe 102 is rotated completely around the z-axis 144 and the uncalibrated direction data 850 are generated for each direction in which the shoe 102 is positioned typically resulting in an elliptically-shaped plot of data, as shown in FIG. 10. The offset position and elliptical shape of the uncalibrated direction data 850 is a result of hard iron and soft iron errors. It is noted that if the magnetometer 202 was calibrated, then the direction data 850 would be arranged in a generally circular shape centered at the origin in FIG. 10 instead of the offset elliptical shape.

At block 904, the entirety of the uncalibrated direction data 850 for the route traversed by the user is generated. That is, in one embodiment, the method 900 of calibration begins when the user completes the run and no further uncalibrated direction data 850 are generated in connection with the run. Depending on the embodiment, the calibration method 900 may be performed by any one or more of the electrical system 110, the smartphone 602, and in the cloud by the remote server 614.

The length of the run during which the uncalibrated direction data 850 are generated corresponds to a predetermined time period. An exemplary predetermined time period is thirty minutes. In other embodiments, the predetermined time period is from one minute to four hours or more. Since the uncalibrated direction data 850 are calibrated after the predetermined time period, the method 900 of calibration is a post-workout or post-run calibration method 900.

Next in block 908, a plane 862 is fitted to the uncalibrated direction data 850 and is defined by the lines 854, 858. As shown in FIG. 10, the plane 862 is angled with respect to the axes 112, 114, 116. The method 900 includes using data processing techniques, such as the least squares method and other linear algebra techniques, to fit and to identify the plane 862 that best fits the data 850. Any other data processing technique may be used to obtain a plane 862 from the data 850. For example, instead of fitting a plane to the data 850, a projection technique may be utilized in which the three-axis data points of the data 850 are projected onto a plane 866 defined by the x-axis 112 and the y-axis 114, a plane 870 defined by the x-axis 112 and the z-axis 114, or a plane 876 defined by the y-axis 116 and the z-axis 114.

Figure 11:
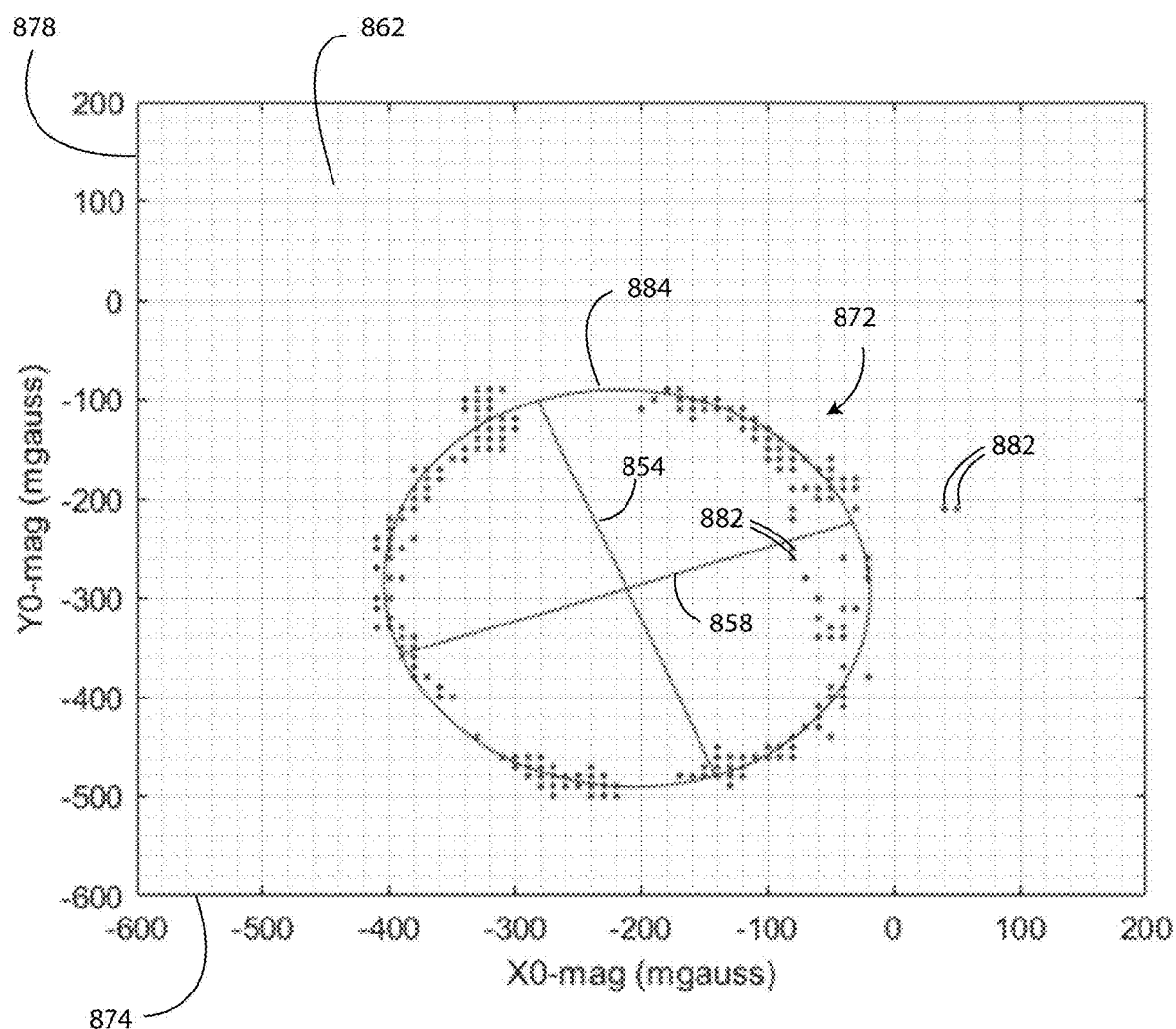
FIG. 11 illustrates a plot of two-axis uncalibrated direction data generated by the fitness tracking system in accordance with aspects of the present invention.

In block 912 of FIG. 9 and as shown in FIG. 11, the three-axis uncalibrated direction data 850 are converted from a plurality of three-axis data points to two-axis uncalibrated direction data 872 located in the plane 862. FIG. 11 illustrates the uncalibrated two-axis direction data 872 after the plane 862 has been fitted to the data 850 and after the three-axis data points have been converted into two-axis data points located in the plane 862. After the plane 862 is fitted, the axes 112, 114, 116 are redefined such that the plane 862 is defined by the xo-axis 874 and the yo-axis 878.

With reference to block 916 of the flowchart of FIG. 9, next the method 900 includes processing the uncalibrated two-axis direction data 872 to reject any outlier data points 882. As shown in FIG. 11, the two-axis direction data 872 includes the outlier data points 882 spaced apart from the generally elliptically positioned data points 872. These outlier data points 882 are typically caused by magnetic interference signals that locally disrupt the Earth's magnetic field. For example, if the user runs near an electrical transformer, an electrical substation, a large electric motor, or any other magnetically "noisy" device, an interference signal emitted by the noisy device may locally change the Earth's magnetic field 240 (FIG. 4A), which may cause the magnetometer 202 to incorrectly identify magnetic north and directional north. The uncalibrated direction data 850 generated while the user is located near the magnetically noisy device may include three-axis outlier data points.

The outlier data points 882 are rejected or filtered from the two-axis uncalibrated direction data 872 according to known processes and techniques including Z-score, linear regression models, and proximity based models. Moreover, in one embodiment, a confidence band is fitted to the two-axis uncalibrated direction data 872 and includes an inner band and/or outer band. The outlier data points 882 are identified as being inside of the inner band and outside of the outer band of the confidence band. After the outlier data points 882 are identified and rejected/deleted, the outlier data points 882 are no longer included in the two-axis uncalibrated direction data 872.

Figure 12:
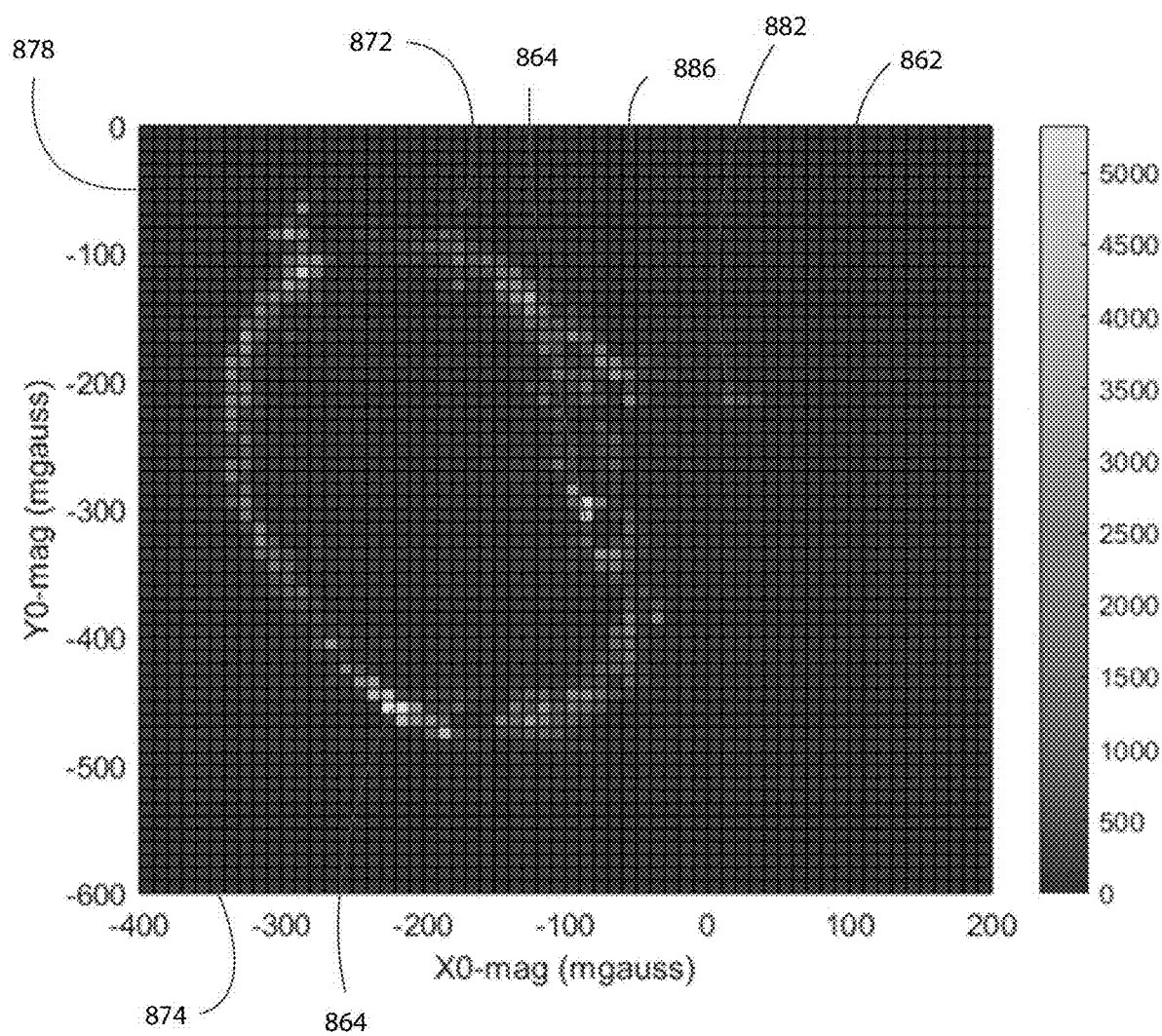
FIG. 12 illustrates a plurality of bins of a 2D histogram approach for identifying outlier data points in the two-axis uncalibrated direction data generated by the fitness tracking system in accordance with aspects of the present invention.

As shown in FIG. 12, in one embodiment, a 2D histogram technique is used to identify, reject, and delete the outlier data points 882. In FIG. 12, the plane 862 is divided in a plurality of bins 886 in which the two-axis uncalibrated direction data points 872 are fitted. Some of the bins 886 contain none of the data 872 and other bins 886 contain at least one data point of the data 872. The outlier data points 882 are identified as being located in the bins 886 having less than a predetermined number of data points of the data 872. For example, the predetermined number of data points is ten, and the data points from any bin 886 containing less than the predetermined number of data points are identified as the outlier data points 882 and are removed from the data 872.

Popular bins 864 are identified as having a number of the data points that is greater than the predetermined number of data points. The data points of the data 872 in the popular bins 864 are valid data points that identify the direction/orientation of the shoe 102 and the user at a particular instant in time.

In the above description, the outlier rejection method of block 916 is performed on the two-axis uncalibrated direction data 872. In other embodiments of the method 900, the outlier rejection method is performed on the three-axis uncalibrated direction data 850 and, as such, may include 3D histogram techniques, for example.

Additionally or alternatively, in some embodiments, the system 100 is configured to apply outlier correction to the outlier data points 882. Outlier correction is a process that adjusts the value of the outlier data points 882 instead of rejecting or deleting the outlier data points 882. Thus, outlier correction converts an outlier data point 882 into a "usable" data point of the direction data 218. The system 100 uses other direction data 218, the acceleration data 230, and/or the movement data 232 to determine a more accurate value for the outlier data points 882 when applying outlier correction.

In block 920 of the method 900 and with reference again to FIG. 11, an ellipse 884 is fit to the two-axis uncalibrated direction data 872. For example, in one embodiment, the 2D histogram of binned data 872 may be processed to fit the ellipse 884. In other embodiments, the ellipse 884 is fit to the data 872 using any suitable data fitting technique. As shown in FIG. 11, the ellipse 884 is centered at about −200 on the xo-axis 874 and at about −300 on the yo-axis 878.

Figure 13:
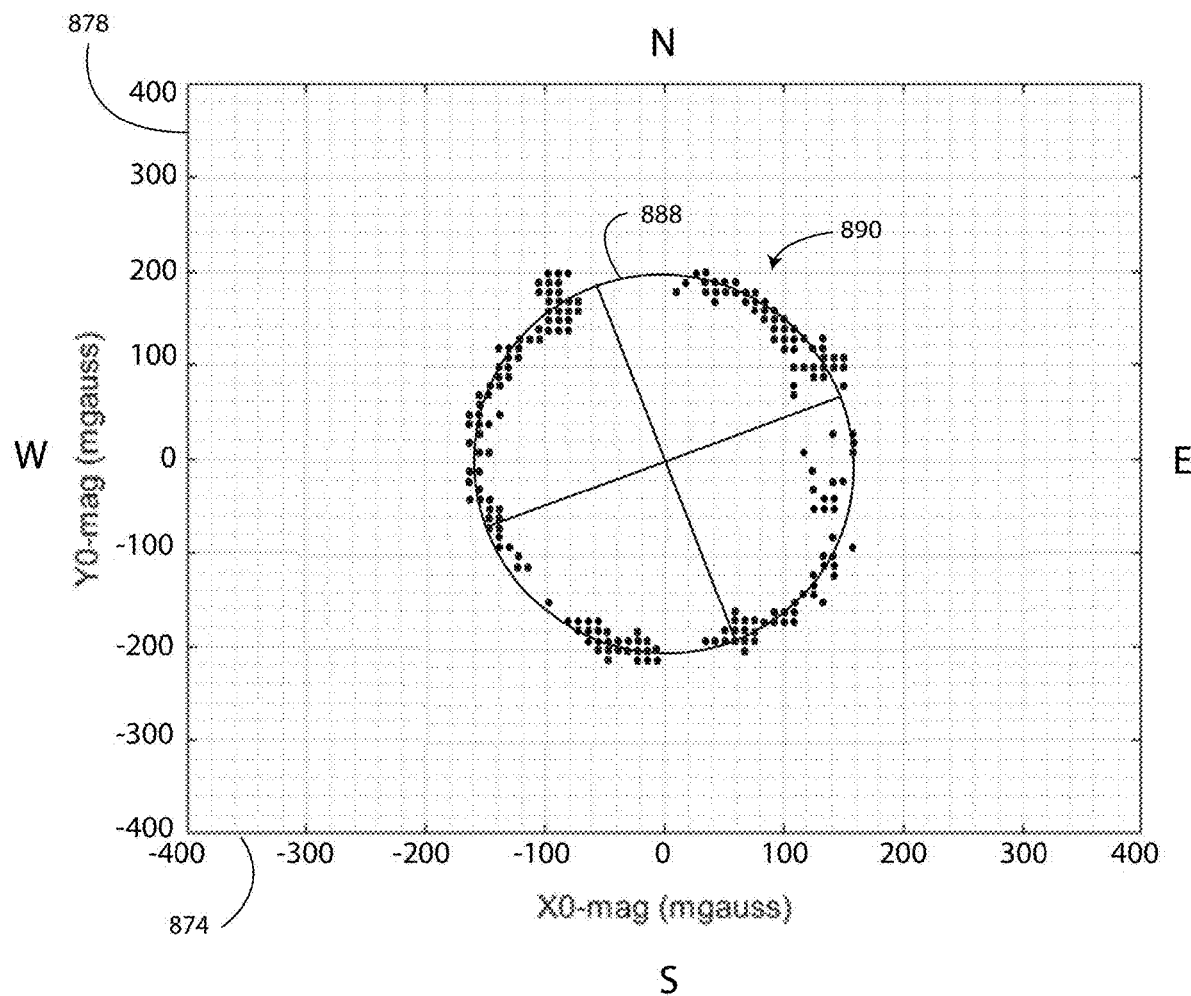
FIG. 13 illustrates a plot of two-axis calibrated direction data generated by the fitness tracking system in accordance with aspects of the present invention.

Next, in block 924 the ellipse 884 and the two-axis uncalibrated direction data 872 are reshaped and repositioned such that the ellipse 884 is converted to a circle having a center located at the origin (0,0) of a coordinate system based on the axes 874, 878. FIG. 13 illustrates the centered circle 888 and the repositioned data, which are two-axis calibrated direction data 890. In FIG. 13, the outlier data points 882 have been rejected and each data point is a calibrated direction data point that accurately identifies a position/orientation of the shoe 102 at a particular instant in time.

The two-axis calibrated direction data 890 are based on the three-axis uncalibrated direction data 850 and are used along with the movement data 232 to generate the route data 702 according to the system and method disclosed herein.

Figure 14:
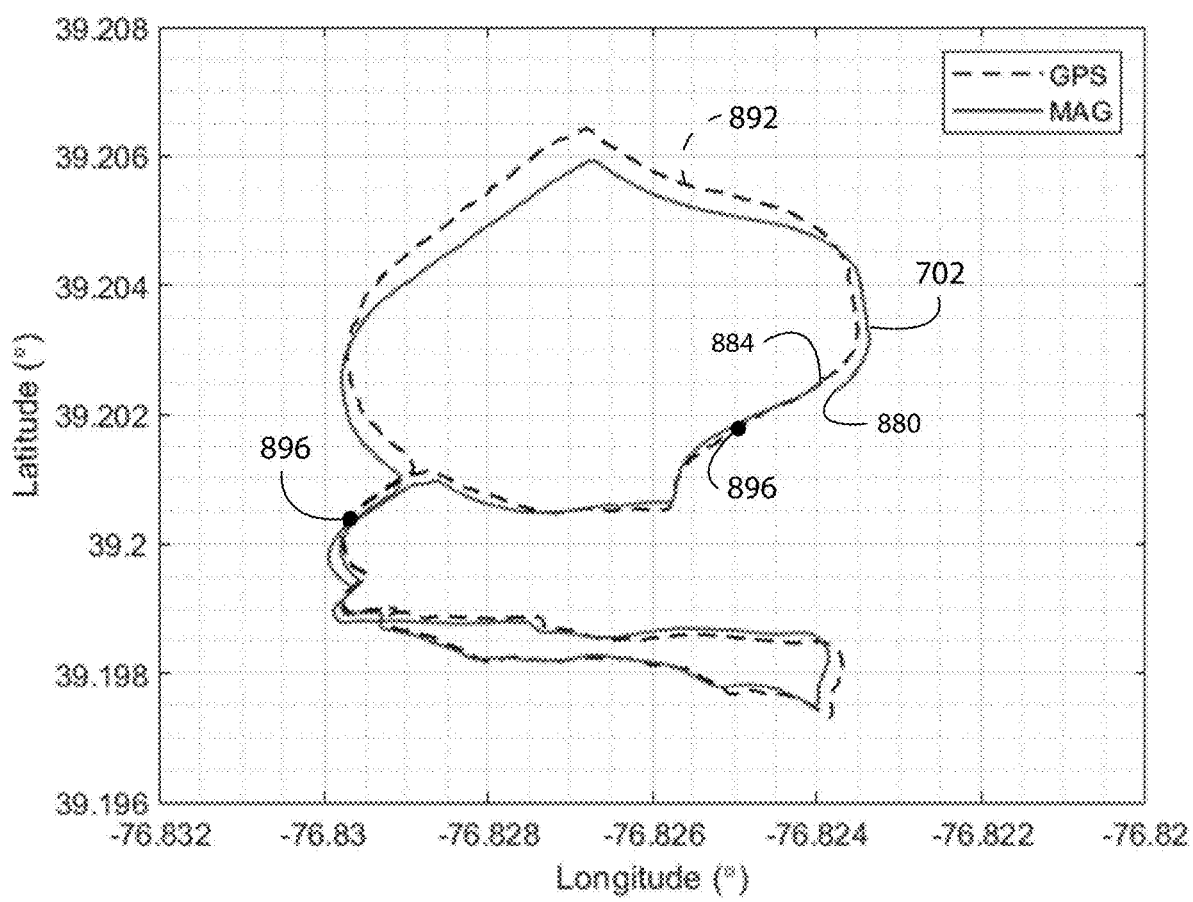
FIG. 14 illustrates a plot of untethered route data generated by the fitness tracking system and satellite-based route data in accordance with aspects of the present invention, the data are shown prior to a start point/end point matching calibration process.

As shown in FIG. 14, the route data 702 generated from the two-axis calibrated direction data 890 are an accurate representation of the location of the user and the shoe 102 during the run. In FIG. 14, the route data 702, which are calculated without satellite location data, are compared to other route data 892 calculated using satellite location data from a satellite-based location device. As shown in FIG. 14, the route data 702 closely corresponds to the route data 892 generated by the satellite-based location device, such as a smartphone.

Figure 15:
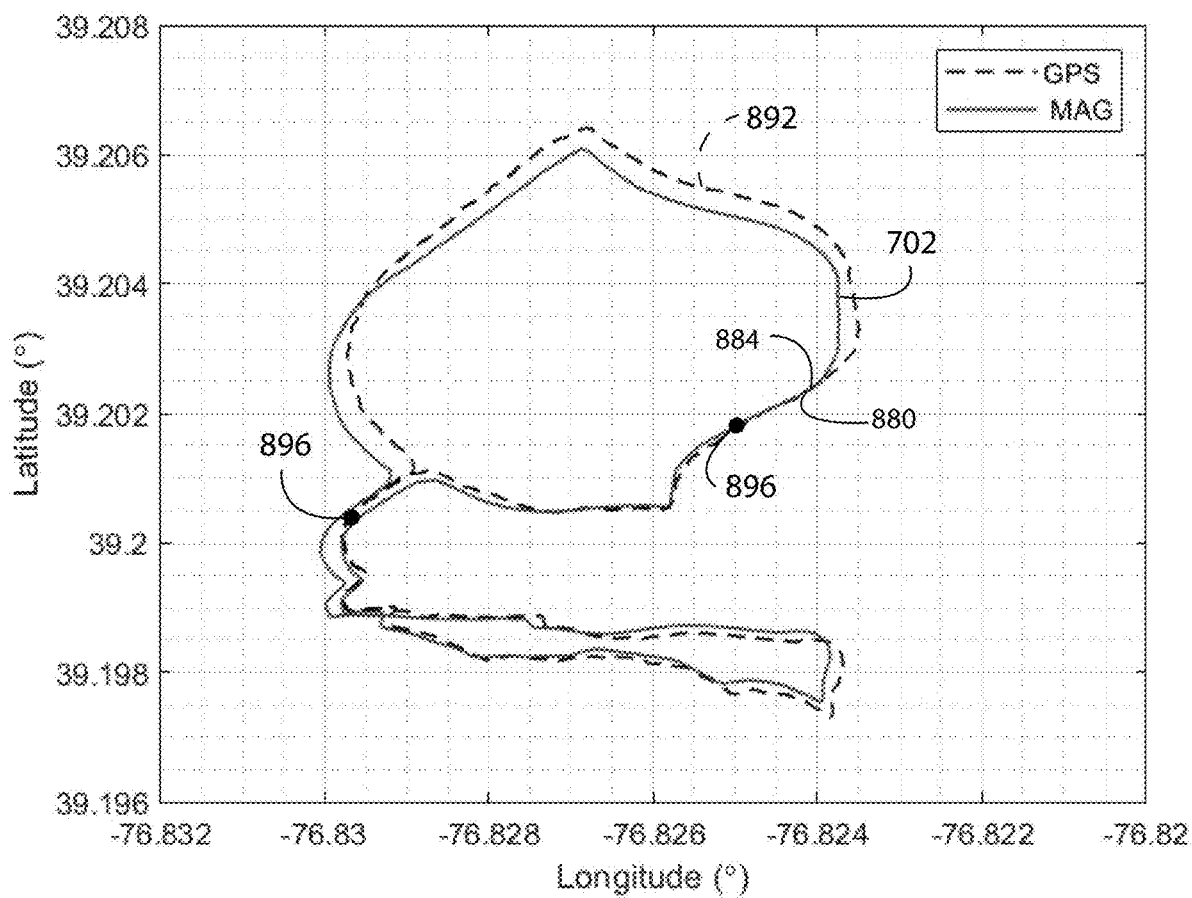
FIG. 15 illustrates a plot of untethered route data generated by the fitness tracking system and satellite-based route data in accordance with aspect of the present invention, the data are shown after the start point/end point matching calibration process.

With reference to FIGS. 14 and 15, in some embodiments, the system 100 is configured to apply a start point/end point matching calibration process to the route data 702. In running the route illustrated in FIG. 14, the user started and stopped the run at the same location. However, as shown in FIG. 14, the route data 702 includes a start point 880 and an end point 884 that are in different locations. The difference in location of the start point 880 and the end point 884 may be based on small errors in determining the route data 702 that accumulate over the duration of the run.

In one embodiment, the system 100 determines a distance between the start point 880 and the end point 884. If the determined distance is less than a first distance threshold and greater than a second threshold, then the system 100 determines that user started and stopped the route in the same location. If, however, the determined distance is greater than the first threshold, then the system 100 determines that the user started and stopped the route in different locations. In response, to determining that the user started and stopped the route in the same location, the system 100 may calibrate the direction data 218 so that the start point 880 of the route data 702 coincides with the end point 884 of the route data 702 as shown in FIG. 15.

Moreover, in some embodiments, the system 100 provides the user with a prompt that inquires if the user started and stopped the run in same location. For example, the prompt may be displayed on a display screen of the electrical device 602. If the user affirms that the route was started and stopped in the same location, then start point/end point matching calibration is performed and the direction data 218 are calibrated so that the start point 880 of the route data 702 coincides with the end point 884 of the route data 702. The start point/end point matching calibration is not performed if the user provides data indicating that the start point 880 and the end point 884 of the route are different. Thus, the data provided by the user are a toggle used by the system 100 to determine whether or not to apply the start point/end point matching calibration process.

A benefit of the post-workout calibration method 900 is that the direction data 218 from the magnetometer 202 is calibrated for each workout/run of the user. In known devices, the magnetometer is calibrated using a standard method during the manufacturing process. However, this initial calibration of the magnetometer losses effectiveness over time and causes the magnetometer to generate progressively less accurate direction data. The inventive fitness tracking system 100 disclosed herein, solves this issue by post-calibrating the magnetometer 202 following each workout or following a predetermined calibration time period. The calibration method 900 accounts for subtle changes in the direction data 218 that occur over time and provides direction data 218 with the greatest possible accuracy. As a result, the route data 702 based on the direction data 218 of the fitness tracking system 100 is typically just as accurate or more accurate than corresponding route data 892 generated by the satellite-based location device.

In a specific embodiment, the calibration method 900 is applied to only the direction data 218 that is generated when the shoe 102 is positioned on the ground, as indicated by the ground contact signals 502, 504, for example. The direction data 218 generated when the user has separated the shoe 102 from the ground may have an unwanted directional/orientation variance due to supination and pronation of the foot of most runners. However, most users strike the ground with their foot/shoe pointed in the direction of movement. Accordingly, in some embodiments of the fitness tracking system 100, only the subset of the direction data 218 that is generated when the shoe 102 is positioned on the ground is used to generate the route data 702 and only the subset of the direction data 218 that are generated when the shoe 102 is positioned on the ground is calibrated according to the calibration method 900.

With reference again to FIG. 14, in another embodiment of the fitness tracking system 100, the system 100 is configured to generate the route data 702 based at least partly on a known location of one or more beacons 896. For example, during the run the user may move past a beacon 896 such as public Wi-Fi station or a Bluetooth low energy ("BLE") station. The transceiver 206 of the electrical system 110 may be configured to receive beacon data from the beacon 896 that are indicative of a location of the beacon 896 and/or can be used to determine a location of the beacon 896 using the Internet 610. The controller 210 uses the location of the beacon 896 to further increase the accuracy of the route data 702 that are generated based on the direction data 218, such that the route data 702 are generated based on the movement data 232, the direction data 218, and the beacon data from the beacons 896. Specifically, the controller 210 adjusts the route data 702, such that the route passes through or near the known location of the beacons 896.

In a similar embodiment of the fitness tracking system 100, the system 100 is configured to work in conjunction with a satellite-based positioning device (i.e. the smartphone 602) during a tethered run to generate even more accurate route data 702. A tethered run occurs when the user carries along the smartphone 602 while running with the shoe 102. Typically, satellite location data, as generated by the smartphone 602, excels in determining a user's general location (i.e. within about 20 feet) but is somewhat less efficient in determining small directional changes of the user. The magnetometer 202, however, excels in determining small directional changes of the user. Thus, the controller 210 uses the direction data 218 from the magnetometer 202 and the satellite location data (e.g. GPS data from a GPS receiver (e.g. a transceiver)) of the smartphone 602, and generates the route data 702 based on the movement data 232, the direction data 218, and the satellite location data. The resultant route data 702 are more accurate than the route data 702 generated from either system operating alone. In this embodiment, the satellite location data may be sporadic or irregular and the system 100 generates accurate route data 702 because the movement data 232 and the direction data 218 generated by the electrical system 110 in the shoe 102 accounts for any gaps in the satellite location data.

In an embodiment of the fitness tracking system 100, the controller 210 implements/utilizes a Kalman Filter to make predictions in the generation of the acceleration data 230, the direction data 218, the movement data 232, satellite location data, and/or the route data 702. The Kalman filter is used by the system 100 to account for gaps in data, anomalous data points, and/or outlier data points. Typically, data generated with the Kalman filter is more accurate than the data it replaces. The Kalman filter produces estimates of the variables of interest (i.e. the acceleration data 230, the direction data 218, the movement data 232, satellite location data, and/or the route data 702) along with estimates of their uncertainties. The Kalman filter then compares these estimates to the measured variables of interest and updates the estimates using a weighted average, with the weighting being determined by the levels of uncertainty associated with the predictions and measurements, respectively.

In another embodiment of the fitness tracking system 100, the data generated by the magnetometer 202 (i.e. the direction data 218) are calibrated to account for drift. As used herein, "drift" refers to a change in a baseline output of the magnetometer 202 over time that typically makes the data generated by the magnetometer 202 less accurate. Typically, drift is caused by temperature changes of the magnetometer 202, the electrical system 110, and/or the shoe 102. In one embodiment, the controller 210 monitors the temperature of the magnetometer 202, the electrical system 110, and/or the shoe 102 using the temperature sensor 212. The controller 210 then applies an appropriate correction factor to the direction data 218 that is based on the temperature sensed by the temperature sensor 212. In other embodiments, drift of the data generated by the magnetometer 202 is accounted for by adjusting calibration parameters over time, either in a continuous or piecewise fashion.

In a further embodiment, an ensemble method is used to calibrate the direction data 218 generated by the magnetometer 202. The ensemble method uses multiple models and then combines outputs of the models to produce an optimal result. For example, a variety of different calibration methods are applied to the direction data 218, and then a mean or median result is selected as the optimal result. The ensemble method of direction data 218 calibration provides uncertainty quantification for the route data 702 generated from the direction data 218. In a specific embodiment, the ensemble method used to calibrate the direction data 218 is performed in a recursive fashion to further refine the estimation of the route data 702.

In yet another embodiment, the fitness tracking system 100 is configured to include vertical position coordinates (i.e. altitude data, height data, and/or elevation data) in the route data 702. As set forth above, the direction data points generated by the magnetometer 202 are in a format corresponding to (x-axis 112, y-axis 116, z-axis 114). Using the acceleration data 230 and the direction data 218, for example, the fitness tracking system 100 generates three-axis route date 702 that includes data corresponding to elevation changes of the user along the route. The three-axis route data 702 corresponds to a three-dimensional record of the route. Evaluation of the three-axis route data 702 enables a user to determine, for example, the elevation change undergone during traversal of the route. The two-axis ground location data of the three-axis route data 702 are calibrated according to the same approach as the two-axis route data 702.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

It will also be appreciated that the various ones of the foregoing aspects of the present disclosure, or any parts or functions thereof, may be implemented using hardware, software, firmware, tangible, and non-transitory computer readable or computer usable storage media having instructions stored thereon, or a combination thereof, and may be implemented in one or more computer systems.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A method of generating route data corresponding to a route traversed by a user wearing a shoe, the method comprising:
   generating three-axis direction data in response to movement of the shoe as the user traverses the route with a magnetometer mounted on the shoe;
   determining two-axis calibrated direction data based on the three-axis direction data after the user traverses the route with a controller operably connected to the magnetometer, the two-axis calibrated direction data corresponding to an orientation of the shoe;
   generating acceleration data with an accelerometer mounted on the shoe as the user traverses the route; and
   determining route data corresponding to the route by processing the acceleration data and the two-axis calibrated direction data with the controller.

2. The method of claim 1, further comprising:
   generating beacon data as the user traverses the route, the beacon data corresponding to a location of at least one beacon; and
   determining the route data by processing the beacon data, the acceleration data, and the two-axis calibrated direction data.

3. The method of claim 2, further comprising:
   generating satellite-based location data as the user traverses the route; and
   determining the route data by processing the satellite-based location data, the beacon data, the acceleration data, and the two-axis calibrated direction data.

4. The method of claim 1, further comprising:
   displaying the route data on a user interface of a personal electronic device operably connected to the controller.

5. The method of claim 1, wherein the three-axis direction data are a measure of magnetic flux density.

6. The method of claim 1 wherein determining two-axis calibrated direction data includes determining two-axis uncalibrated direction data and subsequently changing a position of the two-axis uncalibrated direction data by converting the fitted ellipse to a circle and positioning the circle at an origin of a coordinate system.

7. A fitness tracking system comprising:
   a shoe;
   a magnetometer mounted on the shoe and configured to generate three-axis direction data in response to movement of the shoe during a predetermined time period;
   an accelerometer mounted on the shoe, the accelerometer configured to generate acceleration data corresponding to acceleration of the shoe during the predetermined time period; and
   a controller operably connected to the magnetometer and the accelerometer, the controller configured to (i) generate two-axis direction data based on the three-axis direction data after the predetermined time period, the two-axis direction data corresponding to an orientation of the shoe during the predetermined time period, and (ii) process the two-axis direction data and the acceleration data to generate route data corresponding to traversal of a route by a user of the shoe during the predetermined time period.

8. The fitness tracking system of claim 7, further comprising:
a user interface operably connected to the controller and configured to display the route data.

9. The fitness tracking system of claim 7, wherein the controller is mounted on the shoe.

10. The fitness tracking system of claim 7, further comprising:
a transceiver configured to generate satellite-based location data corresponding to a location of the shoe during the predetermined time period, wherein generation of the route data by the controller is based at least in part on the two-axis direction data, the acceleration data, and the satellite-based location data.

11. The fitness tracking system of claim 1, further comprising:
a transceiver operably connected to the controller and to a remote server, the transceiver configured to receive beacon data from beacon devices during the predetermined time period, wherein generation of the route data by the controller is based at least in part on the two-axis direction data, the acceleration data, and the beacon data.

12. A method of determining route data corresponding to a route traversed by a user with a magnetometer mounted on a shoe, the method comprising:
receiving three-axis direction data generated by the magnetometer during a predetermined time period during which the shoe is in motion;
generating, with a controller operably connected to the magnetometer, two-axis direction data based on the three-axis direction data after the predetermined time period, the two-axis direction data corresponding to the orientation of the shoe during the predetermined time period;
generating, with the controller, route data corresponding to a route traversed by a user wearing a shoe, wherein the route data is based at least in part on the two-axis direction data.

13. The method of claim 12 further comprising receiving acceleration data generated by an accelerometer mounted on the shoe, wherein the route data is further based at least in part on the received acceleration data.

14. The method of claim 12, further comprising:
fitting a plane to the three-axis direction data; and
converting the three-axis direction data to two-axis uncalibrated direction data located in the plane.

15. The method of claim 14, further comprising:
fitting an ellipse to the two-axis uncalibrated direction data; and
changing a position of the two-axis uncalibrated direction data by converting the fitted ellipse to a circle and positioning the circle at an origin of a coordinate system to generate the two-axis calibrated direction data.

16. The method of claim 14, further comprising:
identifying outlier data points of the two-axis uncalibrated direction data; and
deleting the outlier data points from the two-axis uncalibrated direction data.

17. The method of claim 16, further comprising:
fitting a confidence band to the two-axis uncalibrated direction data; and
identifying the outlier data points as the two-axis uncalibrated direction data located outside of the confidence band.

18. The method of claim 14, further comprising:
fitting data points of the two-axis uncalibrated direction data into a plurality of bins; and
deleting the data points of the two-axis uncalibrated direction data that are fitted into a bin of the plurality of bins having fewer than a predetermined number of data points.

19. The method of claim 12, further comprising:
detecting when the shoe is in contact with the ground using an accelerometer mounted on the shoe; and
generating the three-axis direction data only when the shoe is in contact with the ground.

20. The method of claim 12, further comprising:
applying a data smoothing process to the three-axis direction data; and
generating the two-axis direction data based on the three-axis direction data after the application of the data smoothing process.

* * * * *